United States Patent [19]
Greiff et al.

[11] Patent Number: 5,650,568
[45] Date of Patent: *Jul. 22, 1997

[54] GIMBALLED VIBRATING WHEEL GYROSCOPE HAVING STRAIN RELIEF FEATURES

[75] Inventors: Paul Greiff, Wayland; Bernard M. Antkowiak, Oxford, both of Mass.

[73] Assignee: The Charles Stark Draper Laboratory, Inc., Cambridge, Mass.

[*] Notice: The term of this patent shall not extend beyond the expiration date of Pat. No. 5,555,765.

[21] Appl. No.: 440,536

[22] Filed: May 12, 1995

Related U.S. Application Data

[63] Continuation-in-part of Ser. No. 340,190, Nov. 14, 1994, Pat. No. 5,555,765, which is a continuation of Ser. No. 16,139, Feb. 10, 1993, abandoned.

[51] Int. Cl.⁶ .................................................. G01P 9/04
[52] U.S. Cl. .................................. 73/504.09; 73/504.18
[58] Field of Search .......................... 73/504.09, 504.08, 73/503.3, 504.18; 74/5 R, 5 F

[56] References Cited

U.S. PATENT DOCUMENTS

| Re. 32,931 | 5/1989 | Staudte ................................. 73/505 |
| Re. 33,479 | 12/1990 | Juptner et al. ...................... 73/505 |
| 3,053,095 | 9/1962 | Koril et al. .......................... 73/504 |

(List continued on next page.)

FOREIGN PATENT DOCUMENTS

| 55-121728 | 9/1980 | Japan ................................ H03H 9/19 |
| 58-136125 | 8/1983 | Japan ................................ H03H 9/17 |
| 59-037722 | 3/1984 | Japan ................................ H03H 9/17 |
| 59-158566 | 9/1984 | Japan ................................ H01L 29/84 |
| 61-144576 | 7/1986 | Japan ................................ G01P 15/09 |
| 62-071256 | 8/1987 | Japan ................................ H01L 27/06 |
| 62-21164 | 9/1987 | Japan ................................ H01L 29/84 |
| 63-169078 | 7/1988 | Japan ................................ H01L 29/84 |
| 2183040 | 5/1987 | United Kingdom ............ G01F 15/02 |
| 9201941 | 2/1992 | WIPO ................................. G01P 9/04 |
| 9305401 | 3/1993 | WIPO ................................. G01P 9/04 |

OTHER PUBLICATIONS

Barth, P.W. et al., "A Monolithic Silicon Accelerometer With Integral Air Damping and Overrange Protection", 1988 IEEE, pp. 35–38.

Boxenhorn, B., et al., "An Electrostatically Rebalanced Micromechanical Accelerometer," AIAA Guidance, Navigation and Control Conference, Boston, Aug. 14–16, 1989, pp. 118–122.

(List continued on next page.)

*Primary Examiner*—Hezron E. Williams
*Assistant Examiner*—Helen C. Kwok
*Attorney, Agent, or Firm*—Weingarten, Schurgin, Gagnebin & Hayes LLP

[57] ABSTRACT

A gimballed vibrating wheel gyroscope for detecting rotational rates in inertial space. The gyroscope includes a support oriented in a first plane and a wheel assembly disposed over the support parallel to the first plane. The wheel assembly is adapted for vibrating rotationally at a predetermined frequency in the first plane and is responsive to rotational rates about a coplanar input axis for providing an output torque about a coplanar output axis. The gyroscope also includes a post assembly extending between the support and the wheel assembly for supporting the wheel assembly. The wheel assembly has an inner hub, an outer wheel, and spoke flexures extending between the inner hub and the outer wheel and being stiff along both the input and output axes. A flexure is incorporated in the post assembly between the support and the wheel assembly inner hub and is relatively flexible along the output axis and relatively stiff along the input axis. Also provided is a single semiconductor crystal fabrication technique and a dissolved wafer fabrication technique. In one embodiment, the gyroscope includes comb drive electrodes. Also described is a box-shaped strain relief structure for use in the spoke flexures and additional strain relief features.

21 Claims, 15 Drawing Sheets

U.S. PATENT DOCUMENTS

| | | | |
|---|---|---|---|
| 3,113,463 | 12/1963 | Holt, Jr. | 73/505 |
| 3,251,231 | 5/1966 | Hunt et al. | 73/505 |
| 3,370,458 | 2/1968 | Dillon | 73/141 |
| 3,696,429 | 10/1972 | Tressa | 343/180 |
| 3,913,035 | 10/1975 | Havens | 331/107 R |
| 4,044,305 | 8/1977 | Oberbeck | 324/154 R |
| 4,122,448 | 10/1978 | Martin | 343/7.7 |
| 4,144,764 | 3/1979 | Hartzell, Jr. | 73/497 |
| 4,155,257 | 5/1979 | Wittke | 73/497 |
| 4,234,666 | 11/1980 | Gursky | 428/573 |
| 4,321,500 | 3/1982 | Paros et al. | 310/321 |
| 4,326,428 | 4/1982 | Bostwick et al. | 73/504 |
| 4,336,718 | 6/1982 | Washburn | 73/517 B |
| 4,342,227 | 8/1982 | Petersen et al. | 73/510 |
| 4,381,672 | 5/1983 | O'Connor et al. | 73/505 |
| 4,406,992 | 9/1983 | Kurtz et al. | 338/2 |
| 4,411,741 | 10/1983 | Janata | 204/1 T |
| 4,414,852 | 11/1983 | McNeill | 73/765 |
| 4,447,753 | 5/1984 | Ochiai | 310/312 |
| 4,468,584 | 8/1984 | Nakamura et al. | 310/370 |
| 4,478,076 | 10/1984 | Bohrer | 73/204 |
| 4,478,077 | 10/1984 | Bohrer et al. | 73/204 |
| 4,483,194 | 11/1984 | Rudolf | 73/517 R |
| 4,484,382 | 11/1984 | Kawashima | 29/25.35 |
| 4,490,772 | 12/1984 | Blickstein | 361/281 |
| 4,495,499 | 1/1985 | Richardson | 343/5 DD |
| 4,499,778 | 2/1985 | Westhaver et al. | 74/5 F |
| 4,502,042 | 2/1985 | Wuhrl et al. | 340/568 |
| 4,522,072 | 6/1985 | Sulouff et al. | 73/765 |
| 4,524,619 | 6/1985 | Staudte | 73/505 |
| 4,538,461 | 9/1985 | Juptner et al. | 73/505 |
| 4,585,083 | 4/1986 | Nishiguchi | 177/229 |
| 4,590,801 | 5/1986 | Merhav | 73/510 |
| 4,592,242 | 6/1986 | Kempas | 74/5 F |
| 4,596,158 | 6/1986 | Strugach | 74/5 F |
| 4,598,585 | 7/1986 | Boxenhorn | 73/505 |
| 4,600,934 | 7/1986 | Aine et al. | 357/26 |
| 4,619,001 | 10/1986 | Masuda et al. | 356/350 |
| 4,621,925 | 11/1986 | Masuda et al. | 356/350 |
| 4,628,283 | 12/1986 | Reynolds | 331/68 |
| 4,629,957 | 12/1986 | Walters et al. | 318/662 |
| 4,639,690 | 1/1987 | Lewis | 331/96 |
| 4,644,793 | 2/1987 | Church | 73/505 |
| 4,651,564 | 3/1987 | Johnson et al. | 73/204 |
| 4,653,326 | 3/1987 | Danel et al. | 73/517 R |
| 4,654,663 | 3/1987 | Alsenz et al. | 340/870.3 |
| 4,665,605 | 5/1987 | Kempas | 29/434 |
| 4,670,092 | 6/1987 | Motamedi | 156/643 |
| 4,671,112 | 6/1987 | Kimura et al. | 73/505 |
| 4,674,180 | 6/1987 | Zavracky et al. | 29/622 |
| 4,674,319 | 6/1987 | Muller et al. | 73/23 |
| 4,679,434 | 7/1987 | Stewart | 73/517 B |
| 4,680,606 | 7/1987 | Knutti et al. | 357/26 |
| 4,699,006 | 10/1987 | Boxenhorn | 73/517 AV |
| 4,705,659 | 11/1987 | Bernstein et al. | 264/29.6 |
| 4,706,374 | 11/1987 | Murkami | 437/225 |
| 4,712,439 | 12/1987 | North | 74/84 R |
| 4,727,752 | 3/1988 | Peters | 73/517 AV |
| 4,735,506 | 4/1988 | Pavlath | 356/350 |
| 4,736,629 | 4/1988 | Cole | 73/517 R |
| 4,743,789 | 5/1988 | Puskas | 310/316 |
| 4,744,248 | 5/1988 | Stewart | 73/505 |
| 4,744,249 | 5/1988 | Stewart | 73/505 |
| 4,747,312 | 5/1988 | Herzl | 73/861.38 |
| 4,750,364 | 6/1988 | Kawamura et al. | 73/510 |
| 4,761,743 | 8/1988 | Wittke | 364/484 |
| 4,764,244 | 8/1988 | Chitty et al. | 156/630 |
| 4,776,924 | 10/1988 | Delapierre | 156/647 |
| 4,783,237 | 11/1988 | Aine et al. | 437/15 |
| 4,789,803 | 12/1988 | Jacobsen et al. | 310/309 |
| 4,792,676 | 12/1988 | Hojo et al. | 250/231 GY |
| 4,805,456 | 2/1989 | Howe et al. | 73/517 AV |
| 4,808,948 | 2/1989 | Patel et al. | 331/4 |
| 4,815,472 | 3/1989 | Wise et al. | 128/675 |
| 4,834,538 | 5/1989 | Heeks et al. | 356/350 |
| 4,851,080 | 7/1989 | Howe et al. | 156/647 |
| 4,855,544 | 8/1989 | Glenn | 200/61.45 R |
| 4,869,107 | 9/1989 | Murakami | 73/517 R |
| 4,881,410 | 11/1989 | Wise et al. | 73/724 |
| 4,882,933 | 11/1989 | Petersen et al. | 73/517 R |
| 4,884,446 | 12/1989 | Ljung | 73/505 |
| 4,890,812 | 1/1990 | Chechile et al. | 248/674 |
| 4,893,509 | 1/1990 | MacIver et al. | 73/517 AV |
| 4,898,032 | 2/1990 | Voles | 73/505 |
| 4,899,587 | 2/1990 | Staudte | 73/505 |
| 4,900,971 | 2/1990 | Kawashima | 73/862.59 |
| 4,901,586 | 2/1990 | Blake et al. | 73/862.59 |
| 4,916,520 | 4/1990 | Kurashima | 357/71 |
| 4,922,756 | 5/1990 | Henrion | 73/517 R |
| 4,929,860 | 5/1990 | Hulsing, II et al. | 310/366 |
| 4,981,359 | 1/1991 | Tazartes et al. | 356/350 |
| 4,996,877 | 3/1991 | Stewart et al. | 73/510 |
| 5,001,383 | 3/1991 | Kawashima | 310/367 |
| 5,013,396 | 5/1991 | Wise et al. | 156/628 |
| 5,016,072 | 5/1991 | Greiff | 357/26 |
| 5,020,890 | 6/1991 | Oshima et al. | 350/500 |
| 5,025,346 | 6/1991 | Tang | 361/283 |
| 5,038,613 | 8/1991 | Takenaka et al. | 73/510 |
| 5,044,749 | 9/1991 | Califano | 356/345 |
| 5,055,838 | 10/1991 | Wise et al. | 340/870 |
| 5,056,366 | 10/1991 | Fersht et al. | 73/505 |
| 5,060,039 | 10/1991 | Weinberg et al. | 357/26 |
| 5,062,696 | 11/1991 | Oshima et al. | 359/554 |
| 5,090,809 | 2/1992 | Ferrar | 356/350 |
| 5,094,537 | 3/1992 | Karpinski, Jr. | 356/350 |
| 5,099,690 | 3/1992 | Califano | 73/510 |
| 5,138,883 | 8/1992 | Paquet et al. | 73/504 |
| 5,144,184 | 9/1992 | Greiff | 310/312 |
| 5,195,371 | 3/1993 | Greiff | 73/505 |
| 5,203,208 | 4/1993 | Bernstein | 73/505 |
| 5,205,171 | 4/1993 | O'Brien et al. | 73/504 |
| 5,216,490 | 6/1993 | Greiff et al. | 73/517 R |
| 5,226,321 | 7/1993 | Varnham et al. | 73/505 |
| 5,233,874 | 8/1993 | Putty et al. | 73/517 AV |
| 5,241,861 | 9/1993 | Hulsing, II | 73/505 |
| 5,249,465 | 10/1993 | Bennett et al. | 73/577 A |
| 5,251,484 | 10/1993 | Mastache | 73/577 A |
| 5,377,544 | 1/1995 | Dunn | 73/504.08 |
| 5,450,751 | 9/1995 | Putty et al. | 73/504.18 |

OTHER PUBLICATIONS

Boxenhorn, B., et al., "Micromechanical Inertial Guidance System and its Application", Fourteenth Biennial Guidance Test Symposium, vol. 1, Oct. 3–5, 1989, pp. 113–131.

Boxenhorn, B., et al., "Monolithic Silicon Accelerometer", *Transducers '89*, Jun. 25–30, 1989, pp. 273–277.

Boxenhorn, B., et al., "A Vibratory Micromechanical Gyroscope", AIAA Guidance, Navigation and Control Conference, Minneapolis, Aug. 15–17, 1988, pp. 1033–1040.

Howe, R., et al., "Silicon Micromechanics: Sensors and Actuators on a Chip", IEEE Spectrum, Jul. 1990, pp. 29–35.

Moskalik, L., "Tensometric Accelerometers with Overload Protection"., Meas. Tech. (USA), vol. 22, No. 12, Dec. 1979 (publ. May 1980, pp. 1469–1471.

Nakamura, M., et al., "Novel Electrochemical Micro–Machining and Its Application for Semiconductor Acceleration Sensor IC", *Digest of Technical Papers*(1987), Institute of Electrical Engineers of Japan, pp. 112–115.

Petersen, K.E., et al., "Micromechanical Accelerometer Integrated with MOS Detection Circuitry", IEEE, vol. ED-29 No. 1 (Jan. 1982), pp. 23-27.

Petersen, Kurt E., et al., "Silicon as a Mechanical Material", *Proceedings of the IEEE*, vol. 70, No. 5, May 1982 pp. 420-457.

"Quartz Rate Sensor Replaces Gyros", *Defense Electronics*, Nov. 1984, p. 177.

Rosen, Jerome, "Machining In the Micro Domain", *Mechanical Engineering*, Mar. 1989, pp. 40-46.

Teknekron Sensor Development Corporation, article entitled "Micro-Vibratory Rate Sensor", 1080 Marsh Road, Menlo Park, CA 94025, 2 pages, undated.

Bryzek, Janusz et al., "Micromachines on the March", IEEE Spectrum, May 1994, pp. 20-31.

IEEE Robotics & Automation Soc, in coop. w/ASME Dynamic Systems & Control Div., "Micro Electro Mechanical Systms, An Investigation of Micro Structures, Sensors, Actuators, Machines and Systems", IEEE Cat. #93CH3265-6, Library of Congress #92-562734, Ft. Lauderdale, Fl. Feb. 7-10, 1993.

Research Report, Project Title: "Micromachined Vibratory Gyroscope", Researcher: Per Ljung, Berkeley Sensor & Actuator Center, Univ. of Cal. Berkeley, (2 pages), Mar. 1992.

Research Proposal under the PATH Project; "Silicon Microsensors for Automobile Position Localization and Ultrasonic Communication", Robert T. Howe, et al., (24 pages), Dec. 14, 1990.

"Micromachined Vibratory Rate Gyro, Project P7", Per Ljung et al., Berkeley Sensor and Actuator Center, Univ. of Cal., Berkeley, (8 pages), Mar. 10, 1992.

"Multi-Axis Integrated Polysilicon Micro-Gyroscope", Albert P. Pisano et al., Berkeley Sensor & Actuator Center, Univ. of Cal., Berkeley, (6 pages), marked Received Aug. 14, 1992.

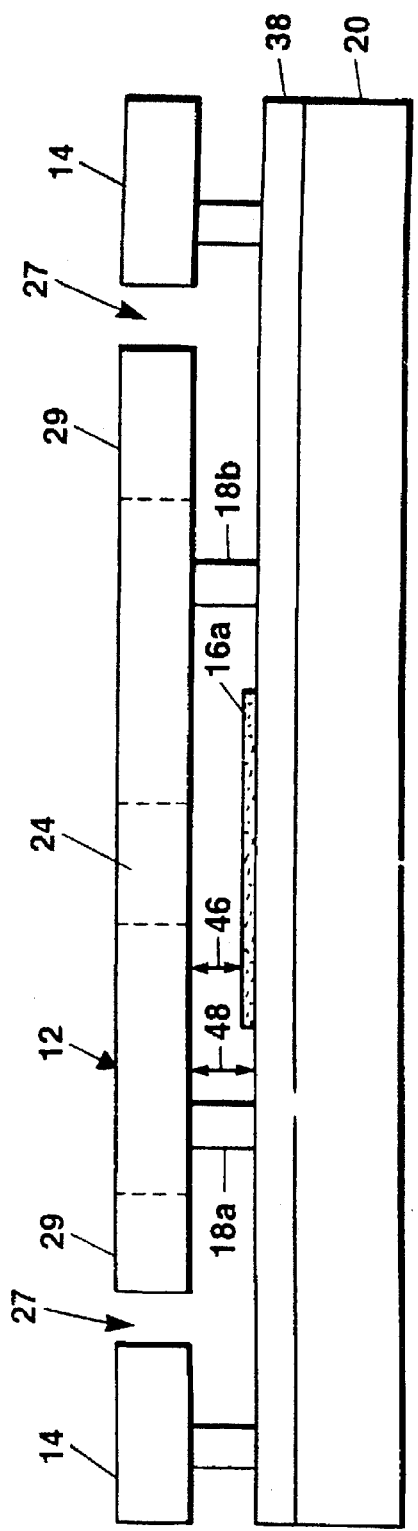
*FIGURE 2*
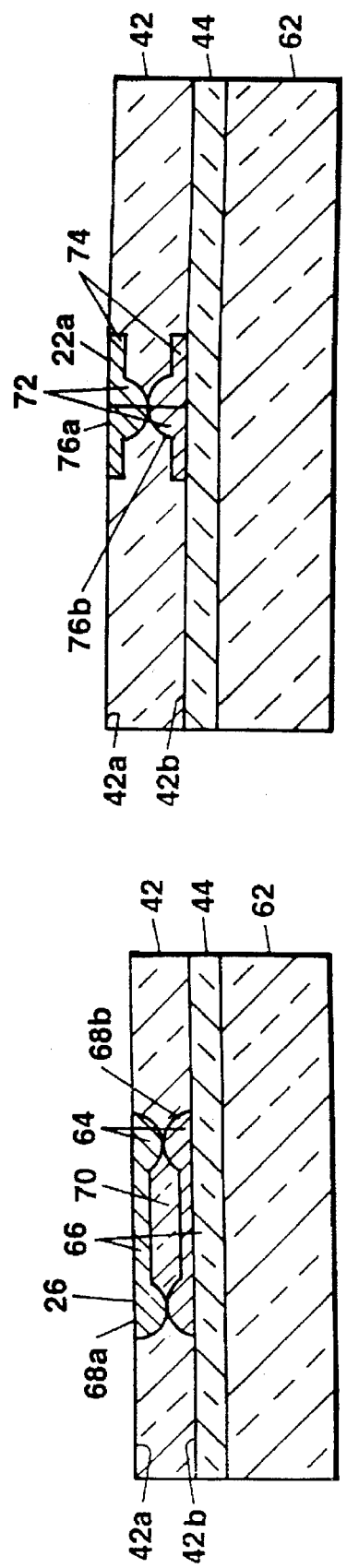
*FIGURE 4A*
*FIGURE 4B*

GIMBALLED VIBRATING WHEEL GYROSCOPE HAVING STRAIN RELIEF FEATURES

RELATED CASE INFORMATION

This application is a continuation-in-part application of a U.S. patent application entitled GIMBALLED VIBRATING WHEEL GYROSCOPE, Ser. No. 08/340,190, filed on Nov. 14, 1994 now U.S. Pat. No. 5,555,765, which is a continuation of U.S. patent application Ser. No. 08/016,139, filed on Feb. 10, 1993 now abandoned.

FIELD OF THE INVENTION

This invention relates generally to vibrational gyroscopes and more particularly, to a vibrating wheel gyroscope.

BACKGROUND OF THE INVENTION

As is known in the art, vibrational gyroscopes are used to measure the rate of a rotation in inertial space. Such sensors generally include a member which is vibrated at a resonant frequency. In response to an input rotational rate induced about an input axis, a vibrational output torque or motion is produced by Coriolis forces.

Vibrational gyroscopes are used for sensing rotational rate in various applications, such as in navigational guidance systems on airplanes, ships, and cars. In such applications, and particularly in cars, the size and cost of the gyroscope can be critical. Moreover, often three gyroscopes arranged mutually orthogonal to one another are used to detect rotation rates about three mutually orthogonal axes and may be combined with three accelerometers. Micromechanical gyroscopes comprised of semiconductor materials are desirable for such applications due to their small size and efficient fabrication techniques.

SUMMARY OF THE INVENTION

In accordance with the invention, a vibrating wheel gyroscope is provided comprising a support oriented in a first plane and a wheel assembly disposed over the support, parallel to the first plane. The wheel assembly is adapted for vibrating rotationally at a predetermined frequency in the first plane and about a drive axis. In response to a rotational rate about a first axis coplanar to the first plane, the wheel assembly vibrates about an output axis, also coplanar to the first plane. Also provided is a post assembly extending between the support and the wheel assembly for supporting the wheel assembly. In accordance with further features of the invention, the wheel assembly includes an inner hub and an outer wheel spaced from the inner hub by a plurality of radially extending spoke flexures. The post assembly includes a post flexure coupled between the support and the wheel assembly inner hub. The post flexure is relatively flexible in response to rates about the output axis and relatively stiff in response to rates about the input axis.

With this arrangement, an improved vibrating wheel gyroscope is provided in which the vibrating wheel assembly is gimballed on the support. More particularly, the post flexure flexes in response to input rates coupled to the output axis; whereas, the spoke flexures flex primarily to allow for the rotational vibration of the wheel assembly in the first plane and about an axis referred to hereinafter as the drive or vibratory axis. By providing separate structures for flexing in response to the rotational drive rates in the plane of the device and the output torque out of the plane of the device, the design of each flexure may be optimized to provide the desired stiffness and flexibility characteristics without sacrificing device performance due to the conflicting requirements of the post and spoke flexures. Additionally, with this arrangement, the resonant frequencies associated with the drive axis and the output axis can be closely matched without compromising other desired characteristics of the flexures. By providing similar resonant frequencies for the drive and output axes, a mechanical gain is realized which effectively multiplies the Coriolis torque, thereby improving the signal to noise ratio of the sensed input rotational rate.

Additionally, by providing the post flexure concentrically within the outer wheel and concentrating the mass of the outer wheel at a maximum distance from the output axis, greater angular momentum of the rotated wheel assembly mass is achieved. Moreover, the use of a "rotary" drive mechanism provides a larger angular displacement of the wheel member for a given device size than is provided by alternate drive mechanisms. This arrangement allows the outer wheel to be heavier and vibrationally rotated through a relatively large angle, thereby increasing the momentum vector about the drive axis. In turn, a larger momentum vector corresponds to a larger output torque for a given input rate, thereby enhancing the sensitivity of the gyroscope.

In accordance with one feature of the invention, the post flexure has a shape selected from the group consisting of "U", "T", "V", or "I" shape. This arrangement provides a flexure that is relatively strong in bending and buckling, but relatively soft in torsion. In this way, improved isolation between the drive energy and the output axis is achieved. Thus, for a given desired output flexure torsional stiffness, maximum stiffness is obtainable for other undesirable modes of motion and overall performance is enhanced.

An additional feature includes providing the outer wheel with hollow portions distal from the input axis and solid portions proximal thereto. Since only that wheel mass having a velocity component orthogonal to the input axis contributes to the output Coriolis torque, this arrangement maximizes the output signal for a given input rate. Additionally, the efficiency of the gyroscope is maximized by minimizing the overall wheel assembly mass.

In accordance with a further aspect of the invention, a method of fabricating a micromechanical device comprises the steps of providing a first silicon layer, providing a second silicon layer thereover as a device layer, and processing a first surface of the device layer. An oxide layer is deposited thereover and is selectively etched to provide an aperture. The process further includes the steps of depositing a layer of polysilicon thereover to form electrodes adjacent to the aperture and depositing an electrically insulating material over the oxide layer. Thereafter, the first silicon layer is removed and a second surface of the device layer processed. Portions of the oxide layer are removed to provide a cantilevered device layer.

With this arrangement, an improved fabrication technique for micromechanical devices is provided. This technique allows for processing of the device layer from both sides or surfaces thereof, thereby facilitating device manufacture and enabling intricately shaped structures to be provided. Additionally, the micromechanical device is formed from a single silicon crystal device layer to provide substantially uniform and reproducible device properties, as well as potentially greater fatigue resistance. The described fabrication technique provides desirable dielectric isolation of the electrodes which reduces leakage currents and parasitic capacitance, thereby minimizing output signal noise. Finally, the described technique facilitates the use of "on-chip" circuitry.

In accordance with one embodiment of the invention, the outer wheel of the wheel assembly, or rotor, has a plurality of finger-like members interleaved with finger-like members of adjacent stator electrodes to provide comb drive electrodes. At least two types of electrodes can be used to drive the rotor, tangential drive gear teeth or comb fingers as illustrated in FIGS. 1 and 8, respectively. Use of comb drive electrodes generally provides a higher capacitance for driving and sensing of the drive motion than gear teeth. On the other hand, if the mechanical Q of the drive axis is large, the gear teeth can provide greater displacement and additional margin against the proof mass banging into the stator drive electrodes.

Also provided are enlarged regions of the outer wheel adjacent to respective sense electrodes. These larger, sense regions serve to increase the out-of-plane sensitivity of the gyroscope and further increase the angular momentum of the vibrated outer wheel.

Strain relief structures, which in the illustrative embodiment are box-shaped, are described. In one embodiment, each of the spoke flexures includes such a box-shaped region. The box-shaped regions serve to reduce the tension force experienced by the spoke flexures as a result of in-plane rotary vibration of the outer wheel. Specifically, in response to rotation of the outer wheel, the box becomes elongated, or stretches, thereby absorbing forces otherwise resulting in axial strain of the spoke flexures. The primary function of the box-shaped strain relief is to provide a linear relationship between drive voltage and proof mass displacement while maintaining a constant resonant frequency. The goal is to maintain constant drive resonant frequency while driving through large amplitude displacement. Large amplitude gives high sensitivity and maintaining constant frequency and linear drive voltage relationship simplifies the drive control loop and ultimately results in being able to operate the device with close drive and sense resonances which also increases sensitivity. Without the "stretch box" structure, as the spokes bend through larger angles, they are required to increase length. This stretching causes a non-linear relationship between frequency, drive voltage and amplitude. Incorporating the "stretch box" allows the box to bend, thereby increasing the effective length of the flexures without stretching them.

The stator is provided with strain relief in the form of a loop-shaped regions extending outward from the rim of the stator between posts of the stator which attach the drive electrodes to the substrate. Additional strain relief is provided by slots in the post flexures which support the wheel assembly. The slots in the post flexures deform to absorb forces experienced by the post flexures in response to fabrication stresses.

Also described is a dissolved wafer process for fabricating the vibrating wheel gyroscope embodiments described herein. In accordance with the dissolved wafer fabrication technique, a first surface of a silicon wafer is patterned and etched to form mesas which will act to define the electrode to proof mass gap. This surface is then doped with high concentration boron to define the thickness of the proof mass. The surface is then patterned and etched, typically by Reactive Ion Etching, to define the perimeter of the device and may include a plurality of finger-like members. This surface is then bonded to a glass substrate containing metallized electrodes. The undoped and lightly doped portions of the substrate are removed by anisotropic etching in EDP, leaving the proof mass suspended over the electrodes and attached to the substrate in the mesa areas.

An alternative, novel, single crystal fabrication technique is described which results in an all silicon structure which has the advantages of better thermal match of device and substrate and allows for the incorporation of on-chip electronics.

BRIEF DESCRIPTION OF THE DRAWINGS

The foregoing features of this invention, as well as the invention itself, may be more fully understood from the following detailed description of the drawings in which:

FIG. 2 is a diagrammatical cross-section of the vibrating wheel gyroscope taken along line 2—2 of FIG. 1;

FIG. 4A is a cross-section of the outer wheel of the gyroscope of FIG. 1;

FIG. 4B is a cross-section of a portion of the gyroscope of FIG. 1 showing an exemplary output flexure thereof;

DESCRIPTION OF THE PREFERRED EMBODIMENT

Figure 1:
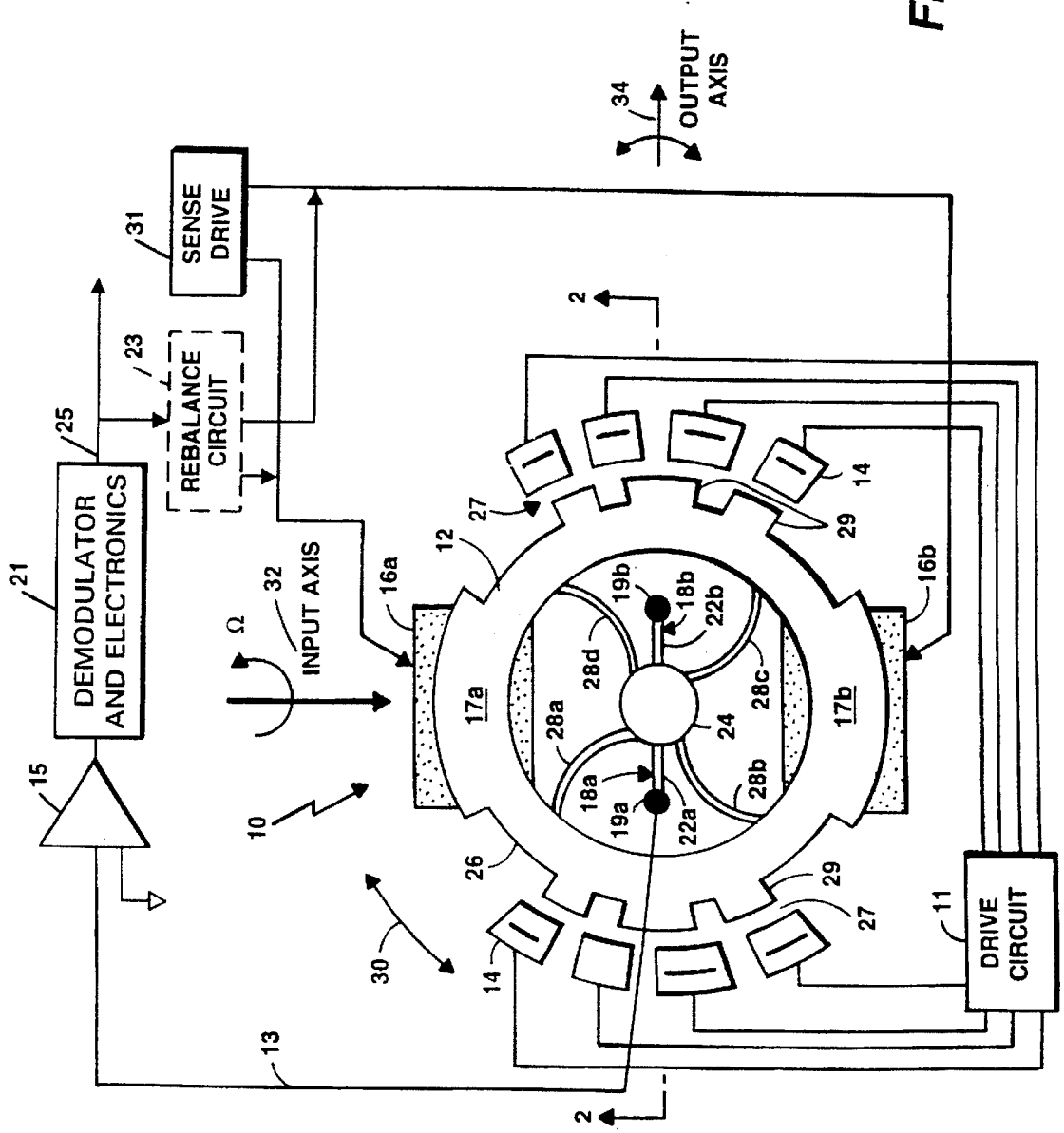
FIG. 1 is a plan view of a vibrating wheel gyroscope in accordance with the present invention.

Referring now to FIG. 1, a vibrating wheel gyroscope 10 is shown to include a vibrating wheel assembly 12, alternatively referred to as a rotor 12, and a plurality of drive electrodes 14. Also shown are a pair of sense electrodes 16a, 16b, here, disposed partially under the wheel assembly 12. Wheel assembly 12 is supported from a semiconductor substrate 20 as will be described in conjunction with FIG. 2. Suffice it here to say that the wheel assembly 12 is supported on the substrate 20 by a pair of post assemblies 18a, 18b. Post assemblies 18a, 18b each include a supporting post 19a, 19b and a post flexure 22a, 22b, referred to alternatively as an output flexure 22a, 22b, respectively. Post flexures 22a, 22b are coupled between a corresponding one of the supporting posts 19a, 19b, respectively, and an inner hub 24 of wheel assembly 12, as shown. Wheel assembly 12 further includes an outer wheel 26 and a plurality of spoke flexures 28a–d extending radially outward from the inner hub 24 to the outer wheel 26. Outer wheel 26 has a plurality of outwardly extending electrodes or wheel protrusions 29. The drive electrodes 14 are disposed outside of the circumference of the wheel assembly 12 facing the wheel protrusions 29 across a gap 27 and may be referred to hereinafter as tangential drive electrodes 14. It is noted that alternatively, wheel protrusions 29 may be interleaved with drive electrodes 14.

A drive circuit 11 is coupled to each of the drive electrodes 14 to cause the wheel assembly 12 to be rotationally vibrated. More particularly, in operation, the drive electrodes 14 are displaced from the wheel protrusions 29 so as to rotationally excite the wheel assembly 12 to impart a vibratory rotational motion to such wheel assembly 12, and in particular to the outer wheel 26 thereof, in the same manner as an electrostatic motor. That is, upon energization of the tangential drive electrodes 14 by drive circuit 11, outer wheel 26 vibrates, or oscillates back and forth in the plane of the wheel assembly 12 in the directions of arrows 30. An axis normal to the plane of the wheel assembly 12, referred to hereinafter as the drive or vibratory axis, is the axis about which the outer wheel 26 is rotated. The outer wheel 26 vibrates in this manner at a rate, or frequency, equal or close to the resonant frequency thereof. By vibrating the wheel assembly 12 at or near its resonant frequency, the magnitude of the required drive voltage provided by the drive circuit 11 is minimized. In devices with very high mechanical Q, the tangential drive may be configured to obtain a very large angular proof mass rotation as there is no structural limitation other than strain in the flexures.

It is noted that the gyroscope 10 can be operated in a self-oscillatory manner wherein an electronic feedback loop maintains the gyroscope 10 at its resonant frequency over a wide range of temperatures. To this end, several of the electrodes 14 may provide "pick-off" capacitors, thereby providing a feedback signal to the drive circuit 11 in order to achieve a self-resonant motor drive.

With the wheel assembly 12 so vibrating, and in response to a rotational rate incident thereon about an input axis 32, an oscillatory output torque is developed about an output axis 34. The resulting output torque is out of the plane of (i.e., non-coplanar to) the wheel assembly 12; whereas, the vibratory rotational motion about the drive axis is in the plane of the device. The drive axis, the input axis 32, and the output axis 34 are mutually orthogonal with respect to one another, with the input 32 and output 34 axes being coplanar with the plane of the wheel assembly 12. The resulting Coriolis torque about the output axis 34 has an oscillatory rate equal to that of the rotation frequency of the wheel assembly 12 and a magnitude proportional to the rate of the input rotational rate.

The gyroscope 10 may be operated "open-loop" in which case the output torque causes concomitant deflection of the wheel assembly 12 out of the plane thereof and about the output axis 34. Alternatively, it may be desirable to operate the gyroscope 10 in a "closed loop" fashion so that, in response to the sensed output torque, a "rebalancing" voltage is applied to the sense electrodes 16a, 16b (or separate electrodes) in order to null the output deflection. In the case of "open-loop" operation, the sense electrodes 16a, 16b operate differentially to measure the magnitude of the deflection of the wheel assembly 12 caused by the output Coriolis torque. The input rotational rate is measured by applying a high frequency AC signal to the sense electrodes 16a, 16b via a sense drive 31. An output signal 13 from one of the output flexures 22a, 22b is coupled to conventional electrostatic sense electronics including an amplifier 15 and a circuit 21 containing a demodulator and other electronics, as shown. The signal 13 is amplified and demodulated with respect to first the carrier frequency of the sense signal and then with respect to the vibration frequency of the outer wheel 26 to provide an envelope or modulating signal which is proportional to the deflection of the wheel assembly 12. In this way, an output voltage signal 25 having a voltage proportional to the input rotational rate is provided.

In the "closed-loop" case, the sense electrodes 16a, 16b are additionally used for torquing the wheel member 12. A rebalance circuit 23 is fed by the output voltage signal 25 having an amplitude proportional to the input angular rate of the gyroscope 10. Rebalance circuit 23 is responsive to the output voltage signal 25 to provide signals which are fed back to the sense electrodes 16a, 16b in order to adjust the amplitude and phase of the AC signals applied thereto. In this way, the wheel assembly 12 is maintained at a null deflection (i.e., no out of plane deflection).

Turning now more specifically to the construction of gyroscope 10, certain desirable features are noted. The spoke flexures 28a–d are designed to be relatively stiff in response to rates about the coplanar input 32 and output 34 axes, but relatively flexible in bending so as to permit rotary vibration of the wheel 26. That is, spoke flexures 28a–d are relatively flexible in response to motion about the drive axis. To accomplish this, the spoke flexures 28a–d are thin but extend a distance into and out of the plane of the page. Stated differently, the spoke flexures 28a–d preferably have a high aspect ratio (i.e., ratio of height out of plane to width), such as between 1:1 and 10:1, in order to provide relative ease of rotational vibration about the drive axis while insuring that such vibration is not coupled to out of plane rates, such as rates about the coplanar input or output axes 32, 34, respectively. With this arrangement, the outer wheel 26 may be partially rotated with respect to the substantially stationary inner hub 24. Here, spoke flexures 28a–d are curved so that when the outer wheel 26 is rotated about the drive axis, spoke flexures 28a–d are deflected by bending primarily and not stretching. Bending deflection is preferable to stretching since the latter can cause non-linearities in the proportionality of the rotational drive voltage to the magnitude of the rotational displacement.

It is desirable that the outer wheel 26 be rotatable about the drive axis through a substantial angle, such as between one and forty-five degrees, so that a large angular momentum vector is established. This is enhanced by providing the post flexures 22a, 22b concentrically within the outer wheel 26 and stiff in the rotary directions, as will be described. The angle through which the outer wheel 26 can rotate is also a function of the curvature and high aspect ratio of the spoke flexures 28a–28d. This arrangement allows the outer wheel 26 to be heavier and rotated through a relatively large angle, thereby increasing the angular momentum. For a given input rate, a larger drive momentum corresponds to a concomitantly larger output torque, thereby enhancing the sensitivity of the gyroscope 10.

An alternate spoke flexure embodiment well suited for large rotational displacement, and in fact complete revolution of wheel assembly 12 if so desired, is a coil spring flexure (not shown). Such a flexure extends from the inner hub 24 of wheel assembly 12 in a spiral pattern to terminate at the outer wheel 26. However, only that mass of outer wheel 26 having a velocity component orthogonal to the input axis 32 contributes to the output Coriolis torque.

The present wheel assembly 12 is designed to maximize the wheel mass orthogonal to the input axis 32 in order to maximize the sensitivity of the gyroscope 10, while minimizing the mass in other parts of the outer wheel 26. It is desirable to minimize the overall mass of the wheel assembly 12 in order to enhance the efficiency of gyroscope 10. In the vibrating wheel assembly 12 of FIG. 1, this optimization of wheel mass is achieved by providing the outer wheel 26 with hollow portions disposed distal from the input axis 32 and solid portions 17a, 17b disposed proximal thereto, the fabrication of which will be described in conjunction with FIG. 4A below. An alternative way of optimizing the mass of wheel assembly 12 is shown in conjunction with the alternate wheel assembly 12' embodiment of FIG. 7, as described below. Suffice it here to say that in the gyroscope 10' of FIG. 7, the mass is optimized by using circular rails in a portions of the outer wheel 26' disposed distal from the input axis 32.

With regard to the post flexures 22a, 22b, it is desirable that such flexures be relatively stiff with respect to bending and buckling so that the rotational input energy is not directly coupled to the output axis 34. Flexures 22a, 22b are designed to be relatively stiff in response to torques about the input axis 32. However, post flexures 22a, 22b are torsionally flexible so that the proper torque frequency about the output axis 34 can be obtained. That is, such post flexures 22a, 22b are relatively flexible in response to torques about the output axis 34. It has been found that post flexures 22a, 22b having a cross-sectional shape of either a "T", a "U", a "I", or a "V" are desirable for meeting these requirements. This is because such shapes yield a post flexure that is relatively strong in bending and buckling but relatively soft in torsion. This arrangement provides improved isolation between the drive energy and the output axis 34, thereby enhancing the accuracy of the gyroscope 10.

It is further desirable that the resonant frequency of the output axis 34 be within approximately 5% of the resonant frequency at which the wheel assembly 12 is rotated about the drive axis. Since the output Coriolis torque is applied to the output axis 34 at the resonant frequency of the drive axis, if the resonant frequency of the output axis 34 is close to that of the drive axis, some mechanical gain is realized which multiplies the Coriolis torque. Preferably the two resonant frequencies are close or equal to each other. With this arrangement, the signal to noise ratio of the sensed input rotational rate is improved.

The overall structure of the vibrating wheel gyroscope 10 of FIG. 1 will become more clear by referring now to FIG. 2, which shows a cross-sectional view taken along line 2—2 of FIG. 1. Wheel assembly 12 is supported from a dielectric layer 38 on the semiconductor substrate 20 with a gap 48 disposed therebetween provided by the post assemblies 18a, 18b, and typically approximately two microns. A typically smaller gap 46 is disposed between the wheel portions 17a, 17b (FIG. 1) and sense electrodes 16a, 16b, as shown. Disposed outside of the circumference of wheel assembly 12 are drive electrodes 14 spaced from the wheel assembly 12, or more particularly the wheel protrusions 29, by gap 27, typically between one and five microns. Wheel assembly 12 is partitioned by dotted lines to show the location of inner hub 24 and the wheel protrusions 29.

Figure 3A:
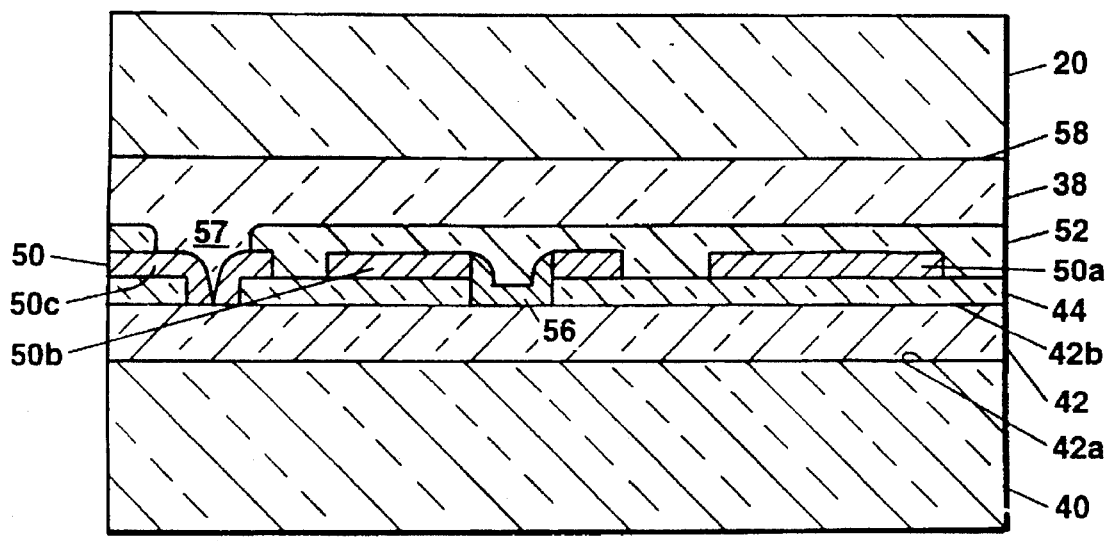
FIG. 3A is a cross-section of a portion of the gyroscope of FIG. 1 at a point during fabrication in accordance with a single crystal construction technique.

Referring now to FIG. 3A, a novel single crystal silicon technique for fabricating micromechanical devices is described in conjunction with the fabrication of gyroscope 10 of FIG. 1. It is first noted that the gyroscope 10 is inverted during fabrication, as is apparent by comparing FIG. 3A which shows a portion of the gyroscope 10 during fabrication and FIG. 3B which shows the device at a later stage of the fabrication. While the process description which follows describes removal of substrate 40 by electrochemical means, other processes, such as mechanical lapping and polishing, may alternatively be used.

As shown in FIG. 3A, p-type silicon substrate 40 has an n-type epitaxial silicon layer 42 grown thereover, such as by chemical vapor deposition. The n-type epitaxial layer 42 provides the device layer, as described below. The thickness of the p-type substrate 40 is not critical since such layer 40 is removed during fabrication. The n-type epitaxial layer 42 here has a thickness of between approximately five and twenty microns. In some variations of the fabrication process, the device layer 42, and more particularly surface 42b thereof, now undergoes further processing, such as high concentration boron diffusion (i.e., before layers 44 or 50 are deposited thereover).

An oxide spacer layer 44 is deposited over layer 42 to a thickness equal to that of the gap 46 (FIG. 2) between the sense electrodes 16a, 16b and the bottom surface of wheel assembly 12, here by example, two microns. Apertures or vias 56 are etched into the oxide layer 44 to provide for the coupling of post assemblies 18a, 18b to the substrate 20 (FIG. 2) and also to allow for electrical contact between drive electrodes 14 and an electrode layer 50. More generally, such through contacts 56 are desirable in locations at which the device layer 42 is anchored, or fixedly coupled, to the substrate 20 (i.e., at post assemblies 18a, 18b and anchor points for drive electrodes 14) and where electrical contact between such device layer 42 and substrate 20 is desired to allow for electrical biasing of layer 42 in cases where substrate 40 is removed by electrochemical means.

A thin layer 50 of polysilicon is deposited thereover and patterned in order to define structures or layers 50a, 50b, and 50c, as shown. Here, layer 50a defines one of the pair of sense electrodes 16a, 16b, layer 50b provides one of the pair of post assemblies 18a, 18b, and layer 50c provides electrical contact between substrate 20, layer 38 and device layer 42. The electrical contact provided by layer 50c is used to electrically bias layer 42 so that substrate 40 may be removed by electrochemistry. The patterned polysilicon layer 50 thus deposited is doped prior to patterning, such as by phosphorous diffusion, to be conductive.

A layer 52 of an electrically insulative material is then deposited, here to a thickness of approximately one micron. Layer 52 is here comprised of silicon nitride and electrically isolates the sense and other electrodes 16a, 16b (i.e., one of which is defined by layer 50a) from the substrate 20. In this way, electrodes 50a are formed in the surface of the layer 52. Or, stated differently, electrode 50a and other portions of layer 50 are thus provided in the surface of layer 52. Opening 57 is provided in layer 52 to allow electrical contact between substrate 20 and device layer 42, as noted above.

Thereafter, layer 38 (see also FIG. 2) of polysilicon is deposited to a thickness of approximately fifty microns. The surface 58 of polysilicon layer 38 is polished flat for bonding to support substrate 20, shown here disposed over layer 38. The layer 38 is mounted to support substrate 20 by any conventional bonding technique. It is noted that alternatively, it may be desirable to increase the thickness of the polysilicon layer 38 and eliminate the supporting substrate 20. That is, a thicker layer 38 can be used to provide device support instead of substrate 20.

Figure 3B:
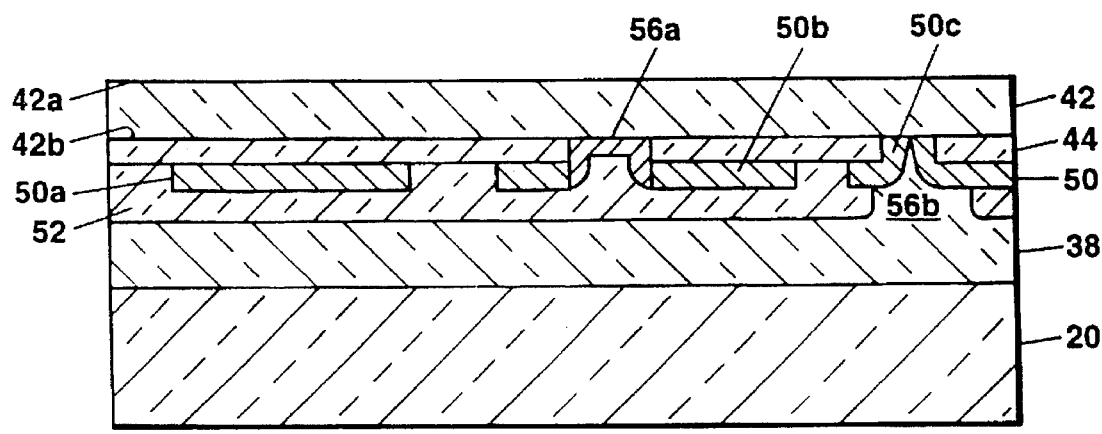
FIG. 3B shows the cross-section of FIG. 3A at a further point in the fabrication thereof.
Figure 3C:
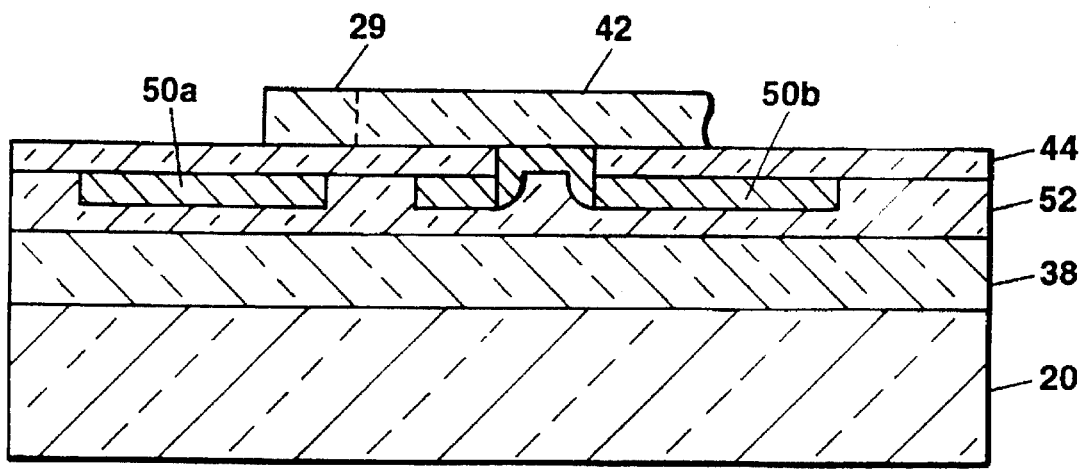
FIG. 3C shows the cross-section of FIG. 3B at a further point in the fabrication thereof.

Thereafter, the p-type silicon substrate 40 is removed, by electrochemical etching or other suitable technique, and the device 10 inverted to provide the structure of FIG. 3B. A second surface 42a of device layer 42 is then processed, such as to provide wheel assembly 12. Any suitable micromechanical device formation technique may be used to provide the wheel assembly 12 of FIGS. 1 and 2 in device layer 42. For example, it may be desirable to selectively dope device layer 42, such as with high concentration boron, to be etch resistant in the pattern of desired wheel assembly 12, in conjunction with anisotropic etching, such as with EDP anisotropic etchant. Alternatively, and particularly where structures such as spoke flexures 28a–d having high aspect ratios are desired, it may be preferable to pattern device layer 42 by reactive ion etching. It is because anisotropic etchants are generally less precisely controllable, that reactive ion etching may be better suited for providing intricate or deep, vertical wall structures. For any method that is used, the unwanted portions of layer 42 are then etched using the oxide layer 44 as an etch stop in order to provide the structure shown in FIG. 3C. It is noted that FIGS. 3C and 3D show only a portion of the cross-section of FIGS. 3A and 3B and, specifically, do not show the through electrical contact provided by layer 50c.

Figure 3D:
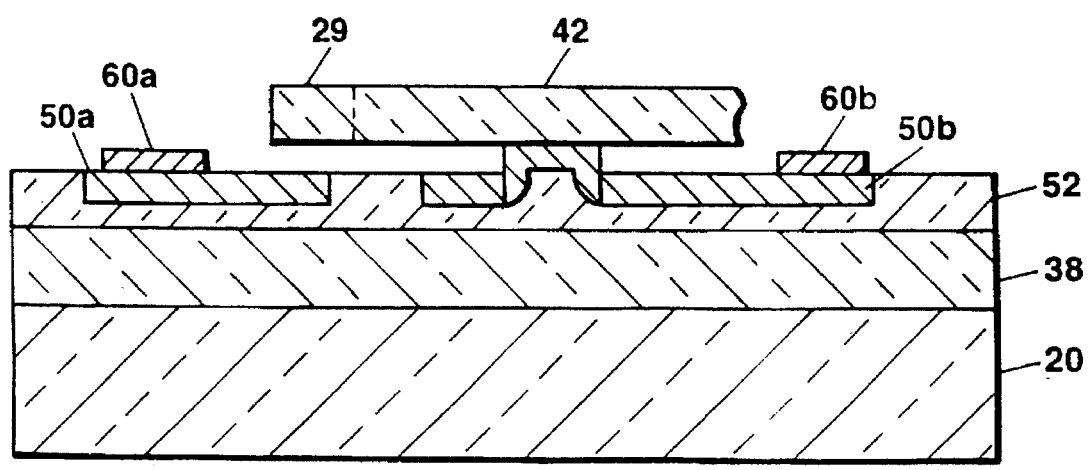
FIG. 3D shows the cross-section of FIG. 3C at a further point in the fabrication thereof.

Once the device layer 42 is etched as described above to provide the wheel assembly 12, the device 10 is placed in hydrofluoric acid to dissolve the oxide layer 44, thereby undercutting and freeing the wheel assembly 12 and drive electrodes 14 from the substrate 20 to provide the "cantilevered beam" structure of FIG. 3D. A layer 60 of gold or aluminum is then deposited and patterned by a photoresist lift off technique where bonding pads, such as 60a, 60b, are desired.

It is noted that the use of high concentration boron diffusion with single crystal structures has heretofore been associated with causing a detrimental residual diffusion gradient and strain which can cause curling of the suspended device layer 42. Here, where high concentration boron diffusion is used, the diffusion is preferably achieved from both the upper and lower surfaces 42a, 42b of the device layer 42, processed at the described fabrication stages. In this way, a more symmetrical diffused region is provided in order to minimize curling of layer 42. Alternatively, layer 42 may be epitaxially grown with an infusion of both Boron and Germanium, in order to provide a substantially strain free and EDP resistant epitaxial layer.

From the resulting structure of FIG. 3D, it is apparent that the sense electrodes 16a, 16b of layer 50a and the output node 13 (FIG. 1) of layer 50b are dielectrically isolated from the semiconductor substrate 20. That is, silicon nitride layer 52 is disposed between the sense electrode 50 and layers 38 and 20. The advantage of such isolation is that reduced leakage currents and parasitic capacitance are achieved, thereby reducing noise in the output 13.

Another advantage of this single crystal fabrication technique is the ability to process the device layer 42 from both the upper and lower surfaces 42a, 42b thereof. That is, as mentioned above, a first surface 42b of device layer 42 can be processed at an early stage in the fabrication of a device (i.e., prior to depositing layers 44 and 50 thereover) whereas a second surface 42a thereof is processed at a later stage.

This arrangement allows for intricately shaped structures having high aspect ratios (i.e., such as spoke flexures 28a–d) and other features of gyroscopes 10, 10' to be realized. Another advantage of this construction method is that the dielectrically isolated substrate 38, 20 may be used as a ground plane. It may also be biased with respect to the wheel assembly as a means of electrically adjusting the resonant frequency of the device.

Additionally, by processing device layer 42 from a single crystal, substantially uniform and reproducible properties are achievable. Furthermore, greater fatigue resistance may be provided. The use of "on-chip" circuitry is facilitated by forming components on substrate 20 with any conventional device formation technique.

Referring next to FIG. 4A, a portion of the cross-section of FIG. 3D through the rim of wheel 26 is shown at an intermediate process step. As mentioned, various processing techniques may be used to provide the wheel assembly 12 in device layer 42. Here, the portion of layer 42 providing the outer wheel 26 of wheel assembly 12 (FIG. 1) is shown. It is noted that layers 20, 38, and 52 are here shown as a single, composite semiconductor layer 62 for clarity. In the following example, it is assumed that high concentration boron doping will be used to provide etch resistance and thus, define geometric shape. Disposed above oxide layer 44 is the device layer 42 in which the wheel assembly 12 is provided. In order to provide the outer wheel 26, portions of device layer 42 are diffused with boron to an etch resistant concentration. More particularly, first portions 64 are diffused to a relatively deep depth, such as between five and ten microns, to provide deep diffused regions 64 and second portions 66 are diffused to a relatively shallow depth, such as one micron, to provide shallow diffused regions 66. It is noted that such deep and shallow diffused regions 64, 66, respectively, are eventually disposed in both the upper and lower surfaces 42a, 42b, respectively, of device layer 42. This arrangement is achieved by processing layer 42 from both the upper and lower surfaces 42a, 42b thereof, as is possible by processing lower surface 42b before oxide layer 44 is deposited, as described above. Specifically, the combination of deep and shallow regions diffused from the upper surface 42a of device layer 42 are referred to generally as region 68a and like regions previously diffused from the lower surface 42b of device layer 42 are referred to generally as region 68b. It is noted that layer 44 is shown here intact for clarity, however portions thereof under wheel portion 26 are removed in order to undercut and free the wheel portion from substrate 62.

With the device layer 42 thus diffused and when processing has reached the appropriate stage, an etchant is introduced to etch a region 70 between the upper and lower diffused regions 68a, 68b in order to remove the semiconductor material therefrom. More particularly, a weep hole (not shown) extends from the upper surface 42a of device layer 42 to the region 70 between diffused regions 68a, 68b. An etchant, typically EDP (i.e., Ethylene Diamine, Pyrocatechol, and water) is introduced through such hole to remove the portion of n-type epitaxial device layer 42 from region 70. In this way, a hollow region 70 is provided between upper and lower diffused regions 68a, 68b, such region corresponding to the hollow portion of outer wheel 26. As mentioned above, by hollowing regions of outer wheel 26, the overall mass of wheel assembly 12 is minimized, thereby improving the efficiency of gyroscope 10.

As mentioned above, it is desirable to provide the post flexures 22a, 22b (FIG. 1) in shapes such as "T", "U", "I", and "V" as the resulting cross-sections provide a beam that is strong in bending and buckling but relatively soft in torsion, the desired characteristics of such flexures.

Referring now to FIG. 4B, a cross-section of a portion of gyroscope 10 is shown to have an "T" shaped post flexure 22a, for example. Here again, the semiconductor layers 20, 38, and 52 of FIG. 3D are shown as a single, composite layer 62 and oxide layer 44 is shown intact for clarity. Device layer 42 is diffused with high concentration boron from both the upper and lower surfaces 42a, 42b thereof. Relatively deep diffused regions 72 are provided in the upper and lower surfaces 42a, 42b of device layer 42 to merge with each other and relatively shallow diffused regions 74 are also provided in the upper and lower surfaces 42a, 42b of layer 42, as shown. The deep and shallow diffused regions formed in the upper surface 42a of layer 42 provide upper diffused region 76a and like regions diffused in the lower surface 42b of layer 42 provide lower diffused region 76b. Note that the processing from surface 42b of layer 42 takes place while the substrate 40 is still attached (FIG. 3A) and prior to the deposition of layer 44. Whereas, the processing from a surface 42a of layer 42 takes place after the structure of FIG. 3B has been obtained and prior to the process step in which the geometry of the wheel member 12 is defined. With this arrangement, an "T" shaped diffused structure is formed which here, defines a post flexure 22a. That is, flexure 22a is coupled between a support post 19a and the inner hub 24 of wheel assembly 12 (FIG. 1). Typically, diffused regions in layer 42 will be diffused in the same or successive diffusion steps so that the structures attached to each other are diffused into each other.

Figure 5:
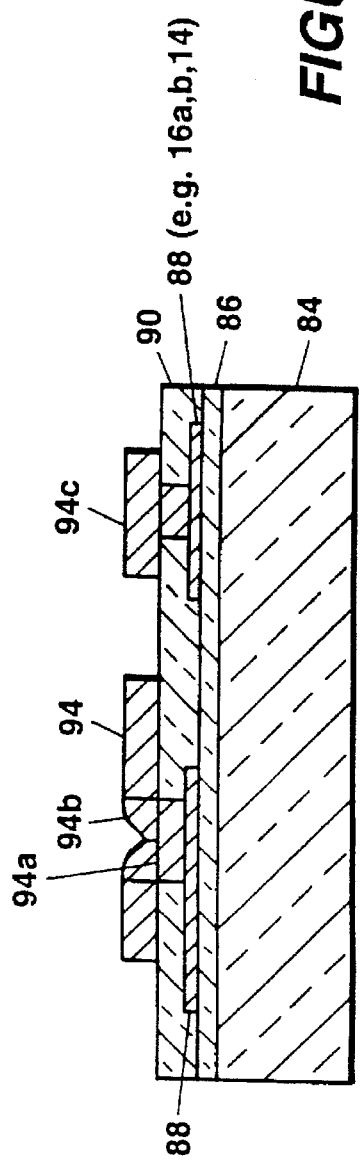
FIG. 5 is a cross-section of a portion of the gyroscope of FIG. 1 fabricated in accordance with a polysilicon construction technique.

Referring now to FIG. 5, an alternate conventional technique using a two layer polysilicon process for fabricating micromechanical devices, and particularly gyroscope 10, will be described. A silicon wafer or substrate 84 is provided with a silicon nitride layer 86 deposited thereover. Layer 86 provides protection for areas of the substrate 84 disposed thereunder, so that such areas are not etched, as will be described. A thin layer of polysilicon 88, highly doped to be conductive, is deposited over the silicon nitride layer 86 and is selectively patterned, as shown, to form electrodes such as for coupling to output flexures 22a, 22b or drive electrodes 14 (FIGS. 1 and 2). Layer 88 may be thus patterned by any suitable technique, such as photolithography combined with reactive ion etching or chemical etching. Layer 88 may also be patterned to provide conductive traces (not shown) coupling the electrodes to subsequently deposited bonding pads (not shown) disposed about the periphery of the device 10.

Once layer 88 is patterned as desired, a sacrificial oxide layer 90 of thickness equal to the desired electrode gap 48 (FIG. 2) is deposited thereover. Layer 90 is here, comprised of glass doped with phosphorous; however, such layer 90 may alternatively be comprised of any insulating material which can be readily deposited and etched. In locations where post assemblies 18a, 18b (FIGS. 1 and 2) are disposed, as well as in locations where drive electrodes 14 are to be anchored to the substrate 84, vias are etched in layer 90.

Thereafter, a relatively thick layer 94 of polysilicon is deposited and patterned to provide the device layer. That is, the wheel assembly 12, the post assemblies 18a, 18b, and the drive electrodes 14 are formed in layer 94. For example, support post 19a and a post flexure 22a may be provided by polysilicon regions 94a, 94b, respectively. Additionally, a drive electrode 14 may be provided by a polysilicon layer 94c. The device is then etched to chemically remove the sacrificial oxide layer 90°. In this way, portions of polysilicon layer 94 are undercut and suspended to free the wheel assembly 12 and drive electrodes 14 of gyroscope 10 from the substrate 84.

As mentioned above, it may be desirable to provide the post flexures 22a, 22b in either a "U" or a "T" shape, for example. Referring now to FIG. 6A, a polysilicon fabrication technique is described for an "T" shaped post flexure 22a. Here, the sacrificial oxide layer 90 is used in conjunction with a second polysilicon layer 94 and a third polysilicon layer 124 to construct an "T" beam flexure 120. That is a first layer 122 of conductively doped polysilicon is deposited and patterned. Layer 96 is a second sacrificial oxide layer and is deposited and then etched to provide an aperture 98. Doped polysilicon layer 124 is deposited in aperture 98 and, with layer 122 deposited thereover, forms the "T" beam structure 120, as shown.

Figure 6B:
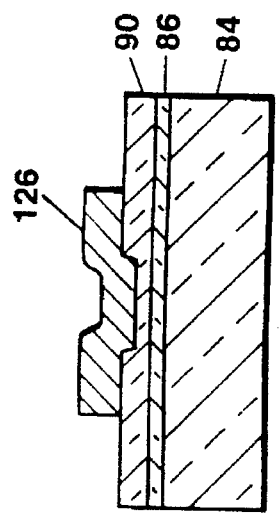
FIG. 6B is a cross-section of a portion of the gyroscope of FIG. 5 showing an alternate output flexure embodiment.
Figure 6A:
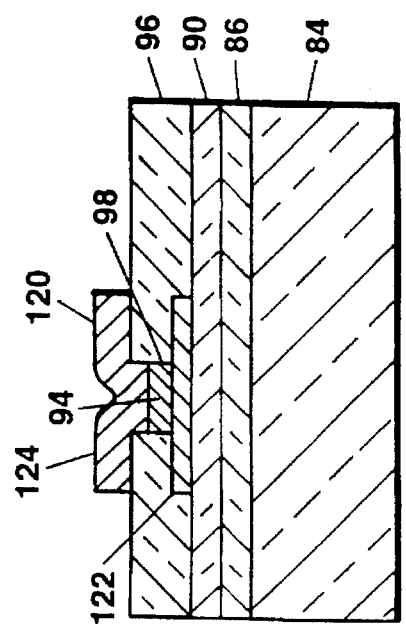
FIG. 6A is a cross-section of a portion of the gyroscope of FIG. 5 showing an exemplary output flexure thereof.

Referring now to FIG. 6B, a "U" shaped post flexure 22a is shown in conjunction with the polysilicon fabrication technique of FIG. 5. Here, the sacrificial oxide layer 90 is partially cut through in a separate photolithography and etching step so that when a layer 126 of doped polysilicon is selectively left thereover, a "U" shaped flexure is provided, as shown.

Figure 7:
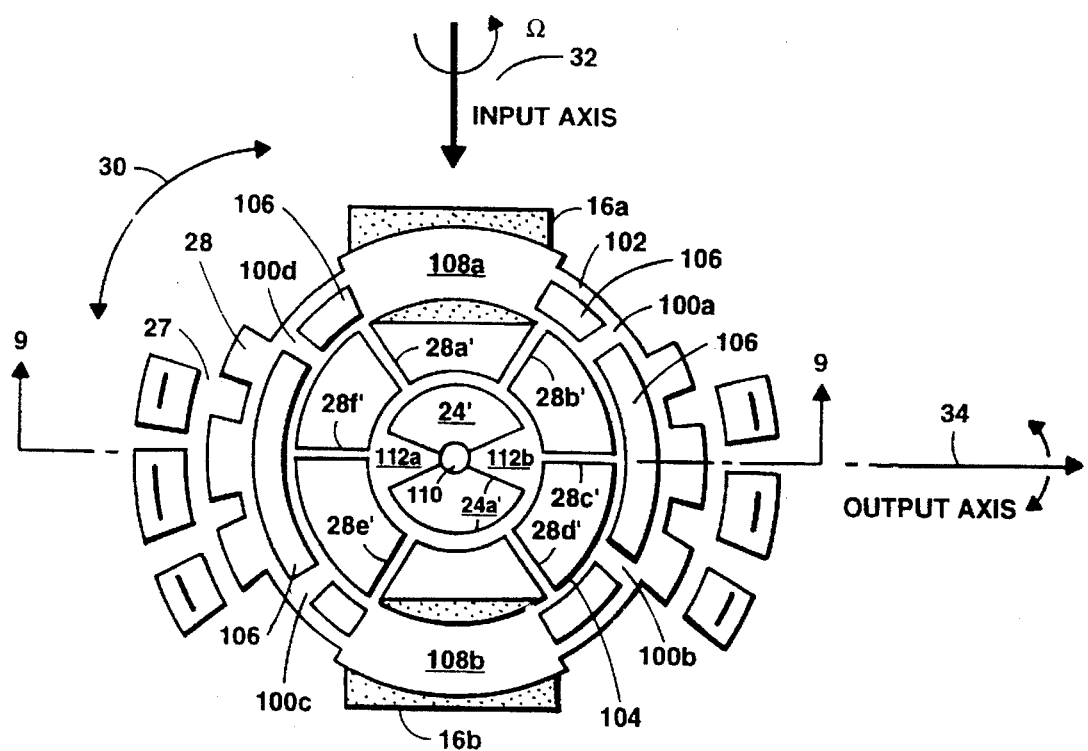
FIG. 7 is a plan view of an alternate embodiment of a vibrating wheel gyroscope in accordance with the present invention.

Referring now to FIG. 7, an alternate embodiment 10' of the gyroscope 10 of FIG. 1 is shown. Vibrating wheel gyroscope 10', like gyroscope 10, includes a vibrating wheel assembly 12' and a plurality of drive electrodes 14. Also shown are the sense electrodes 16a, 16b. Like wheel assembly 12, assembly 12' has an inner hub 24' and an outer wheel 26'. A plurality of spoke flexures 28a'–f' extend between such inner hub 24' and the outer wheel 26', as shown. It may be desirable to provide flexures 28a'–f' to be curved like spoke flexures 28a–d of FIG. 1.

Here however, wheel assembly 12' is supported over the semiconductor substrate 20 by a single support post 110 disposed concentrically within inner hub 24'. A pair of post, or output flexures 112a, 112b extend diagonally upward from the central support post 110 to the outer periphery 24a' of the inner hub 24'. More particularly, inner hub 24' has hollow regions bounded by the outer periphery 24a', the support post 110, and the post flexures 112a, 112b. This arrangement provides post flexures 112a, 112b with stiffness along the input axis 32 and flexibility along the output axis 34, as is desired.

In the gyroscope 10' of FIG. 7, the mass of the outer wheel 26' is optimized (i.e., maximized orthogonal to the input axis 32 and minimized elsewhere, as described above) with the use of circular rails 100a–d, extending between an outer rim 102 and an inner rim 104 of outer wheel 26'. That is, circular rails 100a–d define spaced hollow regions 106 of the outer wheel 26', such hollow regions 106 minimizing the mass distal from the input axis 32. It is noted that end portions 108a, 108b of outer wheel 26' disposed over sense electrodes 16a, 16b, respectively, are solid in order to maximize the mass orthogonal to the input axis 32. Gyroscope 10' may be fabricated in accordance with the single silicon crystal technique discussed above in conjunction with FIGS. 3A–D or alternatively may be fabricated in accordance with the polysilicon technique of FIG. 6, or alternative techniques.

In operation of gyroscopes 10 (FIG. 1) and 10' (FIG. 7), with the wheel assembly 12 or 12' vibrating rotationally about the drive axis and in the plane of the device, the gyroscope 10 or 10' is responsive to an input rotational rate about the input axis 32 thereof. That is, in response to such an input rotational rate, output torque is established about the output axis 34 and an output signal 25 proportional to the input rate is provided, as described above in conjunction with FIG. 1. Gyroscopes 10, 10' provide several advantages over other micromechanical gyroscopes heretofore provided. With the rotary drive mechanism (i.e., rotationally vibrating the outer wheel 26), a larger mass displacement for a given device size is achieved than that of alternate drive arrangements. Moreover, by providing the post flexures 22a, 22b concentrically within outer wheel 26 and concentrating the mass of the outer wheel 26 at a maximum distance from the output axis 34, larger angular momentum of the wheel is achieved. Additionally, the outer wheel 26, 26' is linearly rotatable through a relatively large angle and has a single vibratory resonance. That is, the use of the tangential drive electrodes 14 and curved spokes 28a–d supporting the wheel results in a substantially uniform drive force throughout the drive stroke. As mentioned, the motion of spokes 28a–d is primarily bending and not stretching which is non-linear. The geometry of the structure results in only one principal resonant mode which is a very desirable feature, since a single output mode results in higher manufacturing tolerance and yield.

Moreover, by providing separate structures for flexing in the response to the input rotational rate and the output torque, the gyroscopes 10, 10' are effectively gimballed. That is, spoke flexures 28a–d (FIG. 1) and 28a–f (FIG. 7) flex in response to rotational rates about the drive axis. On the other hand, the post flexures 22a, 22b (FIG. 1) and 112a, 112b (FIG. 7) flex in response to rates about the output axis 34 (i.e., the output torque). Thus, different structures flex in response to motion about the drive and output axes. With this arrangement, the wheel assemblies 12, 12' are effectively gimballed. More particularly, the two axes of rotation constituting such gimbal are the drive and output axes as achieved by the flexing of the spoke flexures and the post flexures, respectively. This gimballed arrangement is desirable since it allows for the resonant frequencies associated with the drive and output axes to be closely matched without sacrificing other desirable design characteristics. That is, the spoke and post flexures can be separately optimized to be flexible about the drive axis or output axis, respectively, while still being designed to have closely matched resonant frequencies. Moreover, closely matched drive and output axis resonant frequencies provide for a mechanical gain which effectively multiplies the Coriolis torque, thereby improving the signal to noise ratio of the gyroscope 10. Furthermore, as noted above, the "T", "U", "V", or "T" shaped output or post flexures (FIG. 4B) enhance the isolation between the drive energy and the output axis 34, thereby improving the gyroscope accuracy.

The single crystal silicon fabrication technique provides several advantages over conventional processing techniques. Namely, the described single crystal fabrication technique allows for processing the device layer 42 from both the upper and lower surfaces 42a, 42b thereof. In this way, the manufacture in general and more particularly, the manufacture of intricately shaped structures, is facilitated.

Additionally, the micromechanical device is formed from a single silicon crystal device layer 42 which provides more uniform and reproducible device properties as well as potentially a greater fatigue resistance.

With the single crystal fabrication, dielectric isolation between the electrodes (i.e., sense electrodes 16a, 16b) is provided. This generally results in lower parasitic capacitance and leakage currents, two phenomena which typically contribute to noise. Thus, in this way, the output signal noise is reduced.

Finally, the described technique facilitates the use of "on-chip" circuitry. That is, with simple fabrication modifications apparent to one of skill in the art, circuitry (such as that associated with the electronics shown in FIG. 1) can be readily fabricated on the same substrate as gyroscopes 10, 10'.

It is noted that the single silicon crystal fabrication technique described above in conjunction with FIGS. 3A–D is well suited for fabrication of other types of micromechanical devices. Additionally, it is noted that it may be desirable to apply the concepts of the gyroscopes described herein to non-micromechanical structures. That is, forming gyroscopes 10, 10' from quartz for example and any other suitable material, is within the contemplation of this invention. It is further noted that the post flexures 22a, 22b may be located "outside" of the rotated mass (i.e., outer wheel 26, for example). In such an arrangement, the post assemblies 22a, 22b extend between the outer wheel 26 and the substrate; whereas, the inner hub 24 coupled to the outer wheel 26 by spoke flexures 28a–d, is rotated (i.e., rather than the outer wheel 26).

Figure 8:
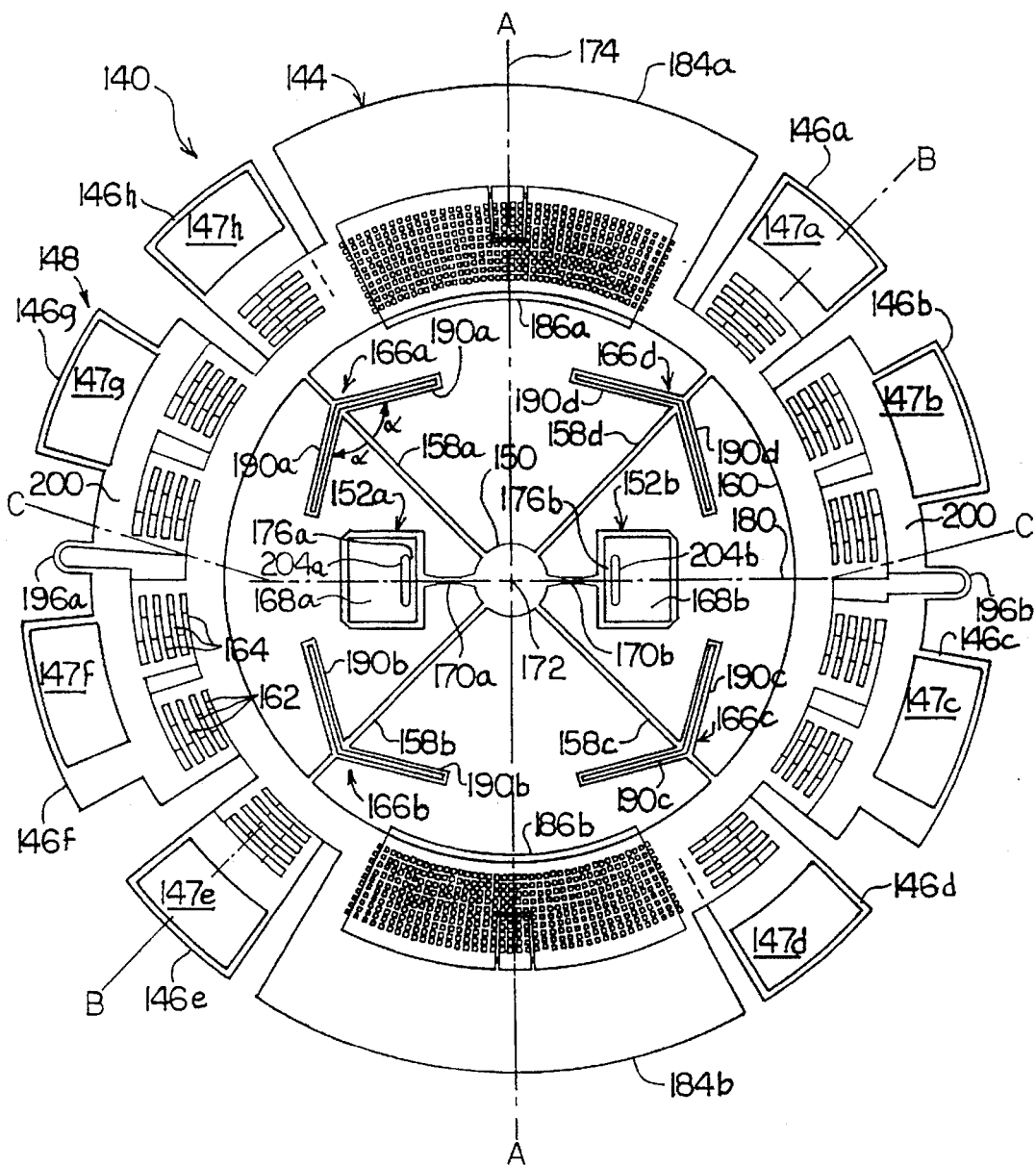
FIG. 8 is a plan view of a further alternate embodiment of a vibrating wheel gyroscope in accordance with the invention.

Referring to FIG. 8, an alternate embodiment 140 of a vibrating wheel gyroscope is shown. Gyroscope 140 is a micromechanical semiconductor device fabricated in accordance with a dissolved wafer process, described below in conjunction with FIGS. 11–17. Gyroscope 140 includes a wheel assembly, or rotor 144 and a stator 148 including a plurality of drive electrodes 146a–h terminating at a plurality of finger-like members 164 and supported over a PYREX™ or semiconductor substrate (FIG. 17) by a corresponding plurality of posts, or mesas 147a–147h. The rotor 144 includes a central hub 150, supported over the semiconductor substrate by a pair of post assemblies 152a, 152b, a plurality of spoke flexures, or spokes 158a–158d and an outer wheel or rim 160 from which a plurality of finger-like members 162 extend. Rotor finger-like members 162 are interleaved with the finger-like members 164 of the stator 148 for electrostatic actuation by the stator 148. Each of spokes 158a 158d includes a respective box-shaped strain relief portion 166a–166d, as will be described.

Each of the post assemblies 152a, 152b includes a respective supporting post 168a, 168b and post flexure 170a, 170b, referred to alternatively as output flexures 170a, 170b. A drive circuit (not shown), like drive circuit 11 in FIG. 1, is coupled to the stator drive electrodes 146a–146h for applying a drive signal to the electrodes 146a–146h.

Upon energization of the drive electrodes 146a–146h, the rim 160 of the wheel assembly 144 vibrates, or oscillates rotationally in the plane of the assembly 144 about a drive axis 172, in the same manner as described above in conjunction with FIG. 1. Like the electronics of FIG. 1, the gyroscope 140 may be operated in a self-oscillatory manner or, alternatively, may be operated open loop. When the wheel rim 160 is vibrating rotationally, a rotational rate incident thereon about an input axis 174 causes the gyroscope 140 to deflect out of the plane of the device about the output axis 180.

A plurality of sense regions 184a, 184b extend from the rim 160 of the wheel assembly 144 along the input axis 174. Sense electrodes 186a, 186b are disposed on the supporting substrate and below respective sense regions 184a, 184b for sensing the out-of-plane deflection of the assembly 144.

Note that the sense regions 184a–184b in the gyroscope 140 of FIG. 8 are larger than the sense regions 17a, 17b in FIG. 1. The enlarged sense regions 184a, 184b are advantageous since the larger sense regions increase the sensitivity with which the out-of-plane deflection is sensed and also because the increased mass on the rim 160 increases the angular momentum of the wheel assembly 144 in rotation.

An important design goal for any gyroscope is to maintain a constant drive resonant frequency while driving through large amplitudes. This achieves higher sensitivity and simplifies the drive control loop. The function of the box-shaped strain relief portions 166a–166d of spoke flexures 158a–158d is to provide a linear relationship between drive voltage and proof mass displacement, which in turn maintains a constant resonant frequency.

As the wheel assembly 144 oscillates at increasingly larger magnitudes, a tensile load is exerted on the spokes 158a–158d. These spokes 158a–158d, which are inherently stiffer in tension than in bending, develop an increasing stiffening effect with a greater percentage of the load carried by tension as the rotational displacement of the wheel assembly increases. The function of the box portions 166a–166d is to elongate to absorb the axial displacement of the respective spoke, and thereby to reduce this non-linear stiffening effect.

Figure 8A:
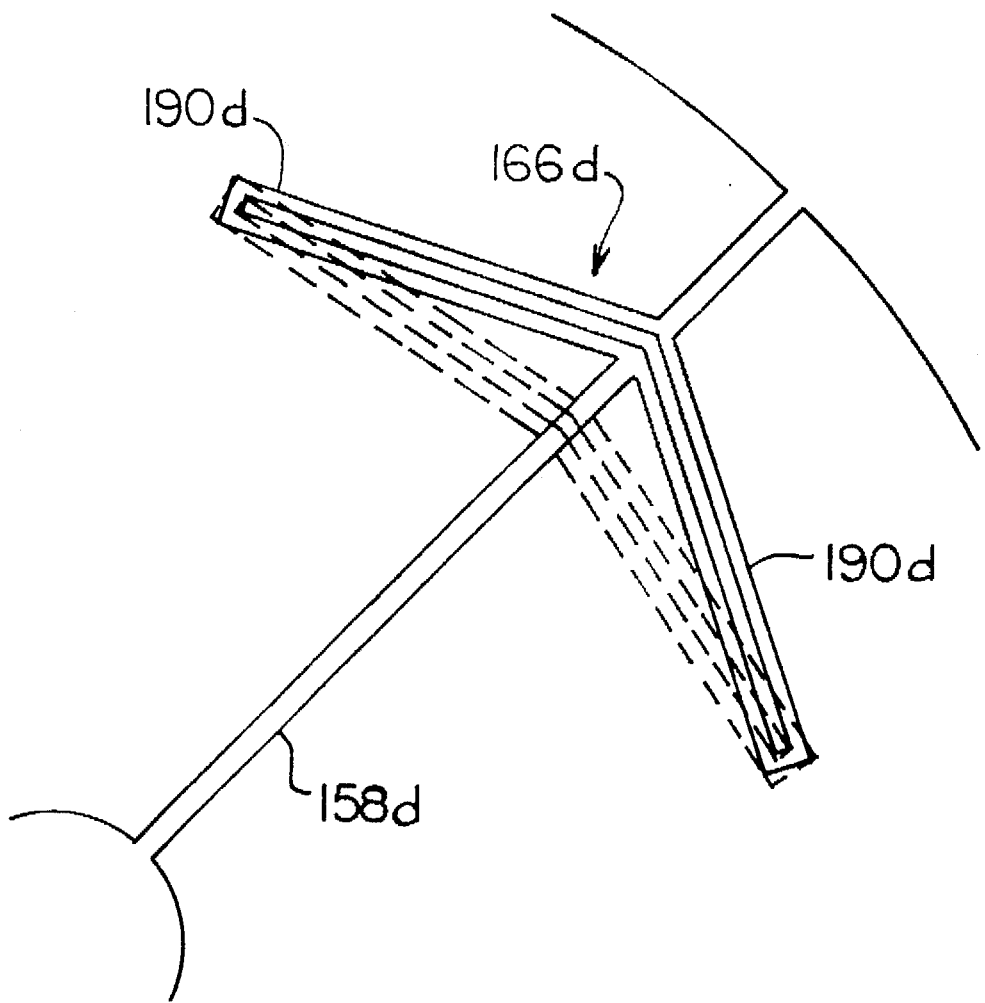
FIG. 8A is an enlarged plan view of a box-shaped strain relief feature of the gyroscope of FIG. 8.

A further advantage of the box-shaped portions 166a–166d is achieved with the "swept", or angled orientation of these regions. That is, rather than extending orthogonally from respective spoke flexures 158a–158d, the box-shaped regions 166a–166d extend from the spoke flexures at an angle α, as shown. With this arrangement, further elongation of the box regions 166a–166d results in a reduction in the tensile stiffness of the respective spoke flexures 158a–158d. This stiffness reduction occurs because additional axial loads on the spoke flexures 158a–158d cause the U-shaped regions 190d of the portions 166a–166d to spread out and increase the angle α. This creates a longer effective moment arm, as shown by the dotted lines in enlarged FIG. 8A. The increased length of the moment arm serves to reduce the axial stiffness of the spoke flexure 158a–158d. In this way, the swept box regions 166a–166d further reduce the non-linear stiffness effect through even larger drive amplitudes. In the illustrative embodiment, the length "1" of the regions 166a–166d is on the order of two-hundred microns, whereas the width "w" of the regions is on the order of twenty microns.

Figure 8B:
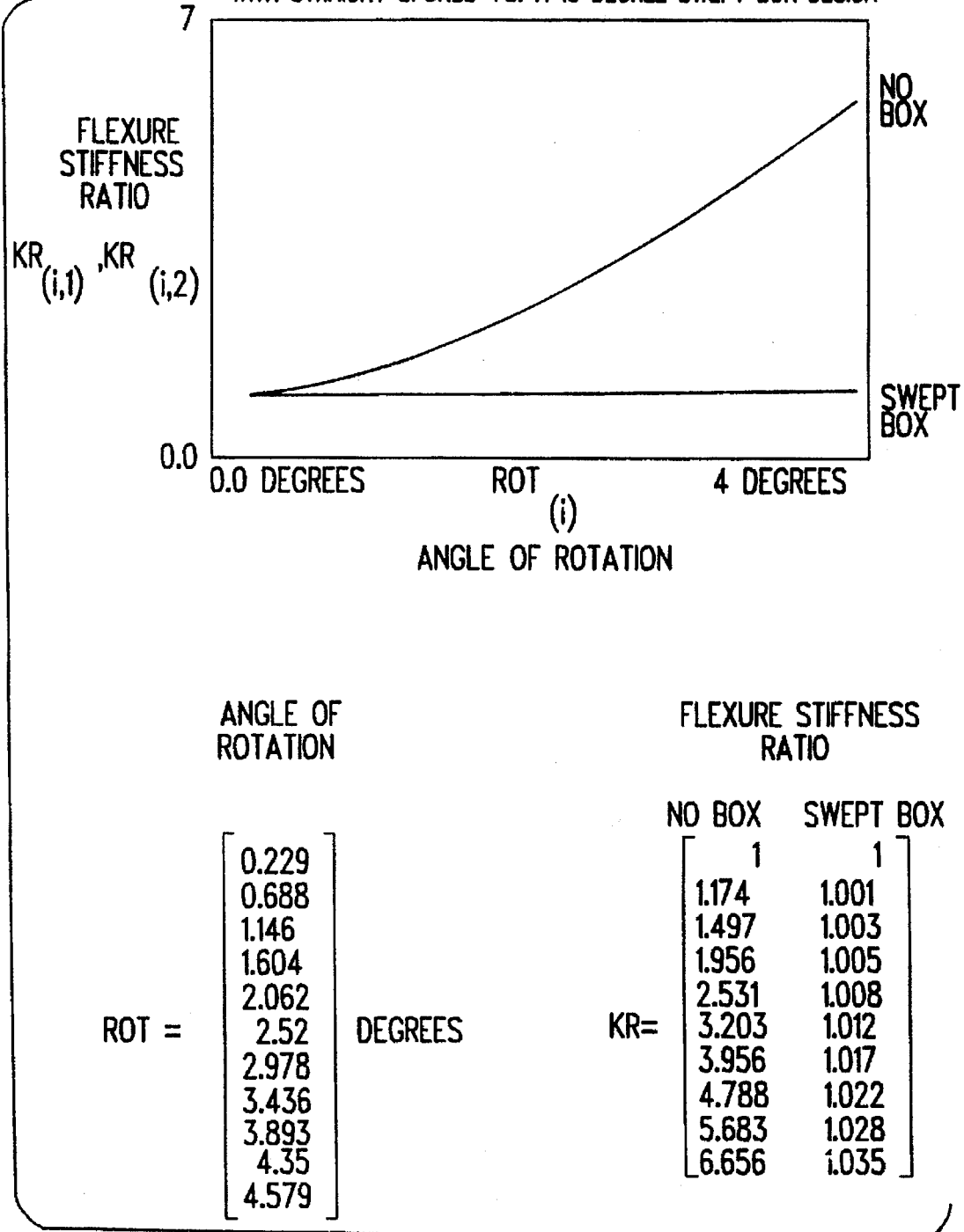
FIG. 8B is a graph showing the relationship between resonant frequency and proof mass displacement for the vibrating wheel gyroscope of FIG. 8.

Referring to FIG. 8B, the stiffness ratio of the spoke flexures 158a–158d of FIG. 8, including stretch boxes 166a–166d and angled at approximately fifteen degrees, is shown to be substantially constant with increasing angles of rotation (i.e., displacement) of the wheel assembly 144. FIG. 8B also shows the stiffness ratio of a vibrating wheel gyroscope having straight spoke flexures, without a stretch box. The stiffness ratio of straight spoke flexures increases significantly with increasing angle of rotation of the wheel. Since resonant frequency is proportional to the square root of stiffness over mass, the resonant frequency of the gyroscope 140 of FIG. 8 is advantageously maintained substantially constant over a range of wheel displacements; whereas, the resonant frequency of a vibrating wheel gyroscope utilizing straight spoke flexures without the stretch box of the present invention varies with wheel displacement.

While the box regions 166a–166d are shown here in use with a vibrating wheel gyroscope 140, it will be appreciated by those of skill in the art that the advantages of these regions render their use desirable in any micromechanical device, such as a tuning fork gyroscope, experiencing displacement non-linearity due to force incident on a proof mass support member, such as a beam or other flexure. It will also be appreciated that, although regions 166a–166d are described as being "box-shaped", alternatively shaped protruding regions positioned along spoke flexures 158a–158d may provide the advantages of the illustrative box-shaped regions and are within the scope of the invention. The effect of the regions 166a–166d can be tailored so as to maintain the resonant frequency constant over a relatively large range of drive signal amplitudes, as shown in FIG. 8B. Alternatively however, in certain applications, it may be desirable to design regions 166a–166d so as to provide a negative change in resonant frequency as a function of drive signal amplitude.

Gyroscope 140 additionally includes loop-shaped regions 196a, 196b extending outward from the stator 148 along the output axis 180 and providing additional strain relief. More particularly, loop regions 196a, 196b are positioned between ones of the drive electrodes 146a–146h which are interconnected by rim portions 200 of the stator 148. During fabrication, regions 200 are subject to stresses. These stresses are caused by the boron doping which imparts etch resistance to desired regions. The boron atom is smaller than the silicon atom which it replaces in the semiconductor lattice. Stress is also caused in the case of use of a PYREX™ substrate by the thermal expansion differences between PYREX™ and silicon. The loop regions 196a, 196b relieve such stresses by bending in response to forces on the rim regions 200.

Also provided on the gyroscope 140 are additional strain relief features in the form of slots 204a, 204b formed in the top surface of support posts 168a, 168b, respectively, which define tension relief beams 176a, 176b. During fabrication, the output flexure region is stressed by both the boron diffusion, which causes differential shrinkage with respect to the undoped silicon substrate, and by the thermal mismatch between the PYREX™ substrate and the silicon wheel assembly during anodic bonding. Since the posts are directly in line with the output flexures 170a, 170b, the stress created can be very high. The tension relief beams 176a, 176b prevent geometric distortion or fracture due to buckling. As will be described below, some advantage is taken of this situation by providing an area where the strain relief beams may be enlarged in the final device by laser trimming. This provides a means for adjusting the resonant frequency of the output flexures. Techniques for laser trimming in this manner are discussed in U.S. Pat. No. 5,144,184 entitled MICROMECHANICAL DEVICE WITH A TRIMMABLE RESONANT FREQUENCY STRUCTURE AND METHOD OF TRIMMING SAME issued on Sep. 1, 1992 to Paul Greiff, which is incorporated herein by reference.

Figure 9:
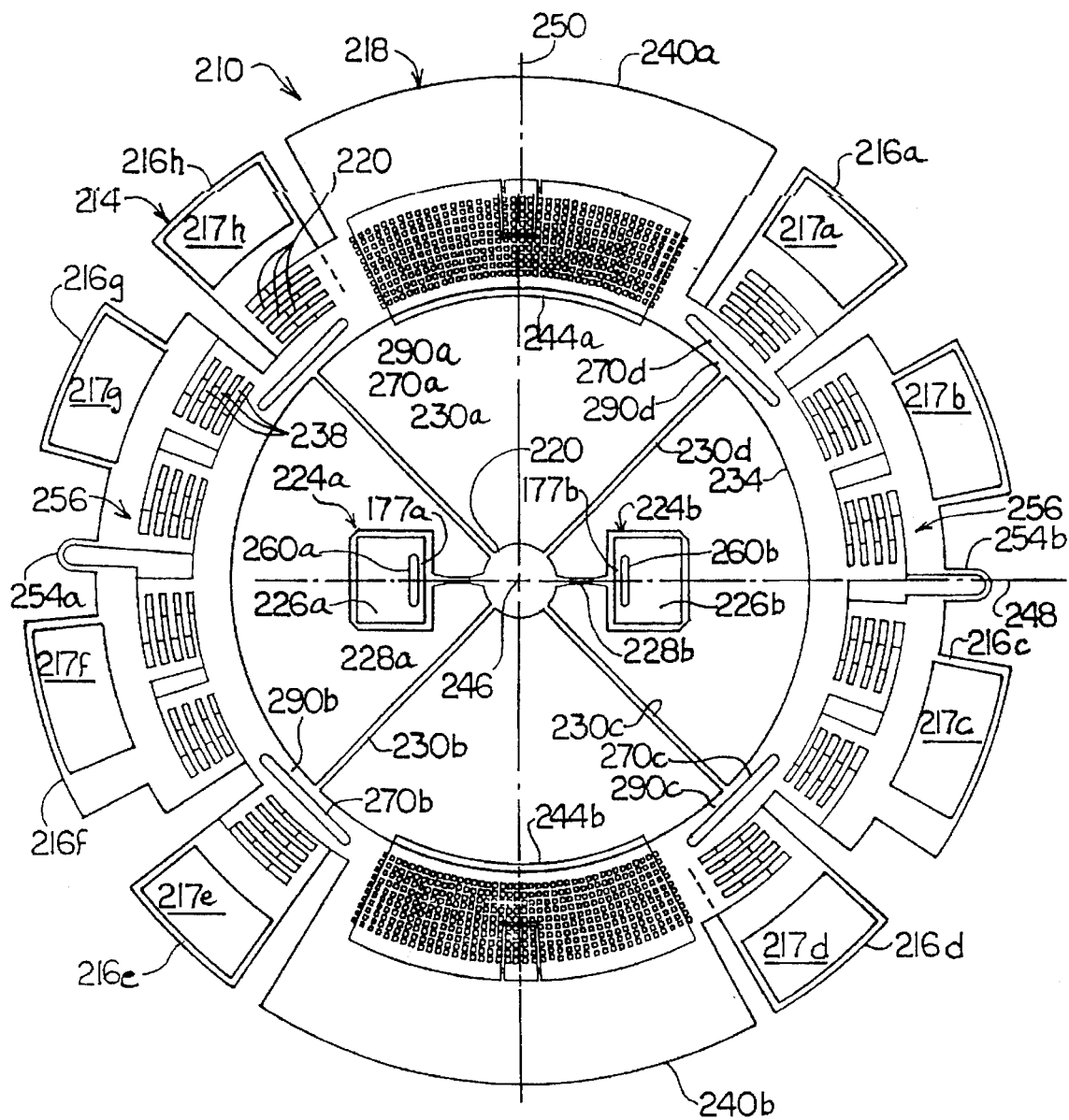
FIG. 9 is a plan view of another alternate embodiment of a vibrating wheel gyroscope in accordance with the invention.

Referring now to FIG. 9, a further alternate vibrating wheel gyroscope 210 is shown. Gyroscope 210 is similar to gyroscope 140 of FIG. 8, in that gyroscope 210 includes a stator 214 having a plurality of electrodes 216a–216h supported over a substrate (not shown) by respective posts 217a–217h and a plurality of finger-like members 220 extending therefrom. The gyroscope 210 additionally includes a rotor, in the form of a wheel assembly 218. Wheel assembly 218 includes an inner hub 220, supported over a semiconductor substrate by a pair of post assemblies 224a, 224b. Each of the post assemblies 224a, 224b includes a post 226a, 226b and an output flexure 228a, 228b extending from the inner hub 220 to terminate at a respective support post 226a, 226b. Support posts 226a, 226b are anchored to the semiconductor substrate so as to suspend the wheel assembly thereover.

The wheel assembly 218 further includes a plurality of spoke flexures 230a–230d extending between the inner hub 220 and an outer rim 234 of the wheel assembly. Like the wheel assembly 144 shown in FIG. 8, the wheel assembly 218 of FIG. 9 further includes a plurality of finger-like members 238 extending from portions of the outer rim 234 and interleaved with the finger-like members 220 of the stator 214, as shown, to form a comb-drive arrangement. Sense regions 240a, 240b of the wheel assembly 218 are positioned over respective sense electrodes 244a, 244b. The gyroscope 210 of FIG. 9 operates in the same manner as gyroscope 140 of FIG. 8 in that, when gyroscope 210 is rotationally vibrated about a drive axis 246, the gyroscope 210 deflects out of the plane of the wheel assembly 218 and about an output axis 248 in response to input rotational rates about an input axis 250.

Gyroscope 210 includes loop-shaped strain relief regions 254a, 254b, like loop-shaped regions 196a, 196b of FIG. 8. More particularly, loop-shaped regions 254a, 254b are positioned between ones of the stator electrodes 216b, 216c and 216f, 216g which are interconnected by a rim portion 256. With this arrangement, in response to stresses in the stator rim portions 256, the respective loop-shaped regions 254a, 254b elongate to absorb such fabrication induced stresses and therefore, to minimize the stresses on the stator rim portions 256. The gyroscope 210 additionally includes slots 260a, 260b etched into the support posts 226a, 226b respectively. As discussed above in conjunction with like slots 204a, 204b of FIG. 8, slots 260a, 260b in the support posts 226a, 226b create tension relief beams 177a and 177b which also act to absorb fabrication stresses.

The gyroscope 210 of FIG. 9 includes an additional strain relief feature in the form of slots 270a–270d etched into the outer rim 234 of the wheel assembly 218, as shown. These slots create tension relief beams 290a–290d. More specifically, each of the beams 290a–290d is positioned adjacent to an end of a respective spoke flexure 230a–230d, as shown. Beams 290a–290d absorb tension forces on the spoke flexures 230a–230d in response to the rotational motion of the outer rim 234 of the wheel assembly. That is, in response to such rotational motion, the beams 290a–290d stretch to alleviate the tension on the respective spoke flexures 230a–230d, in a similar manner as box-shaped portions 166a–166d in FIG. 8.

Figure 10:
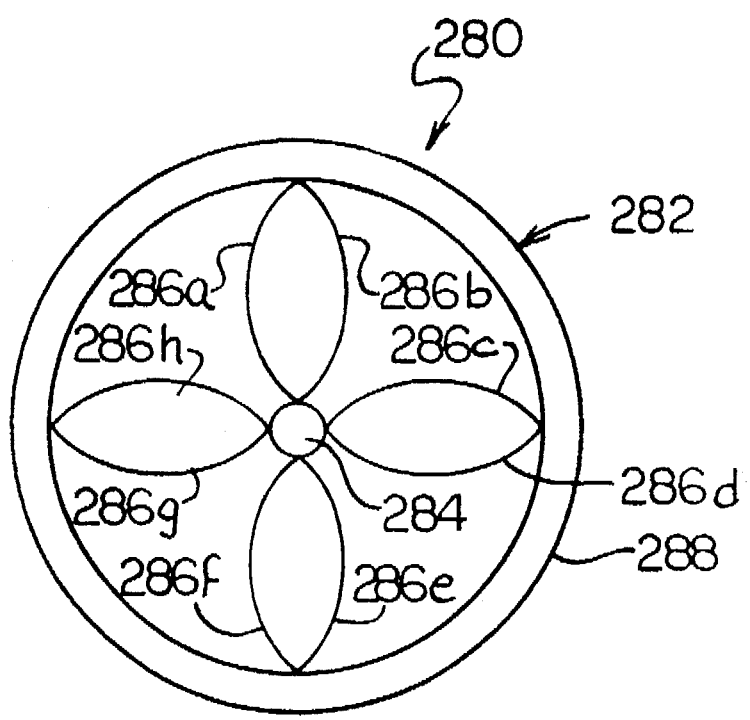
FIG. 10 is a simplified plan view of a vibrating wheel gyroscope including symmetrical curved spoke flexures.

Referring to FIG. 10, a simplified vibrating wheel gyroscope 280 is shown to include alternative spoke flexures 286a–286h. More particularly, the portion of gyroscope 280 shown in FIG. 10 includes an inner hub 284 attached to an outer rim 288 of a wheel assembly 282 by a plurality of curved beam spoke flexures 286a–286h. As is apparent, the curved beams 286a–286h are symmetrical. With this arrangement, regardless of the direction in which the wheel assembly 282 is being rotationally vibrated, the forces on the wheel assembly, and thus also the response of the wheel assembly to inertial forces, is substantially symmetrical.

Figure 11:
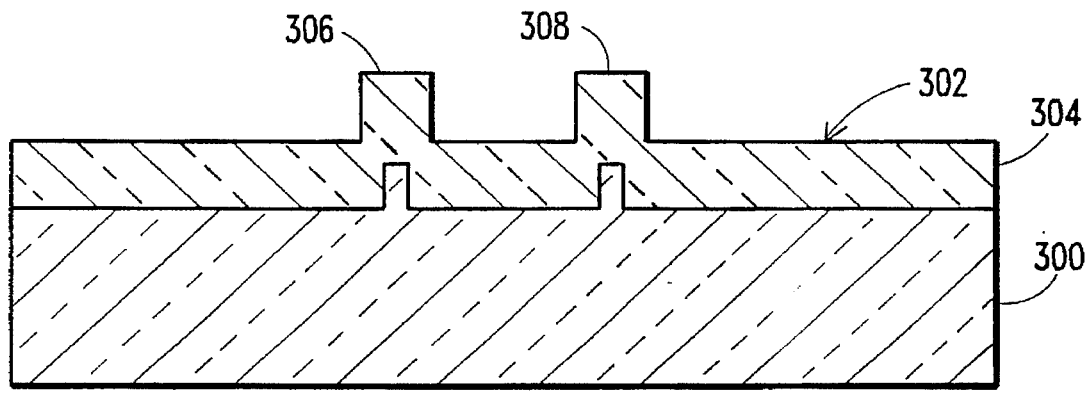
FIGS. 11, 12, 13, 14, 15 and 16 are cross-sectional views of the gyroscope of FIG. 8 at various stages of fabrication in accordance with a fabrication technique of the invention.
Figure 12:
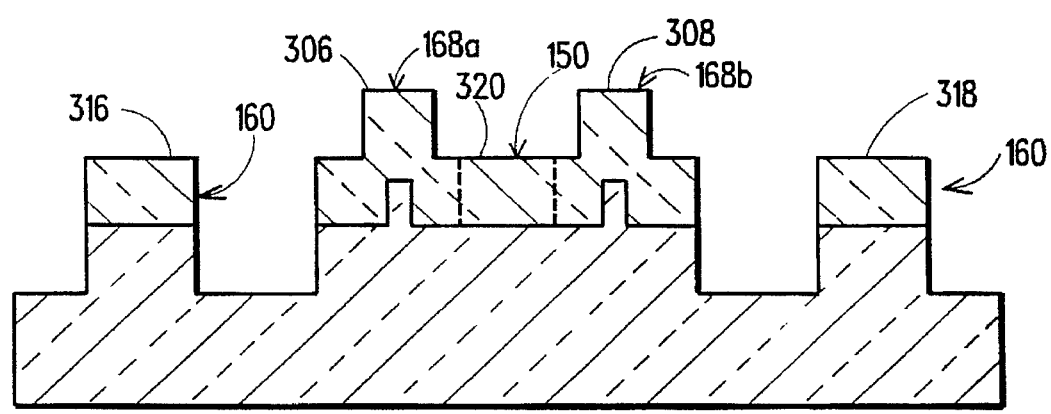
Figure 13:
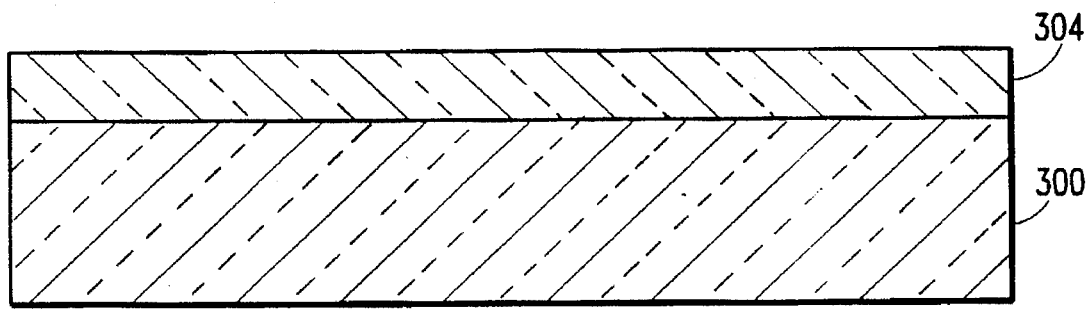
Figure 14:
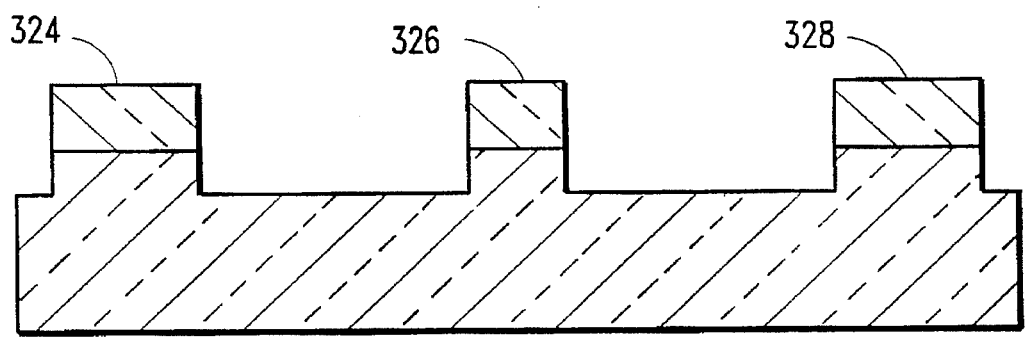
Figure 15:
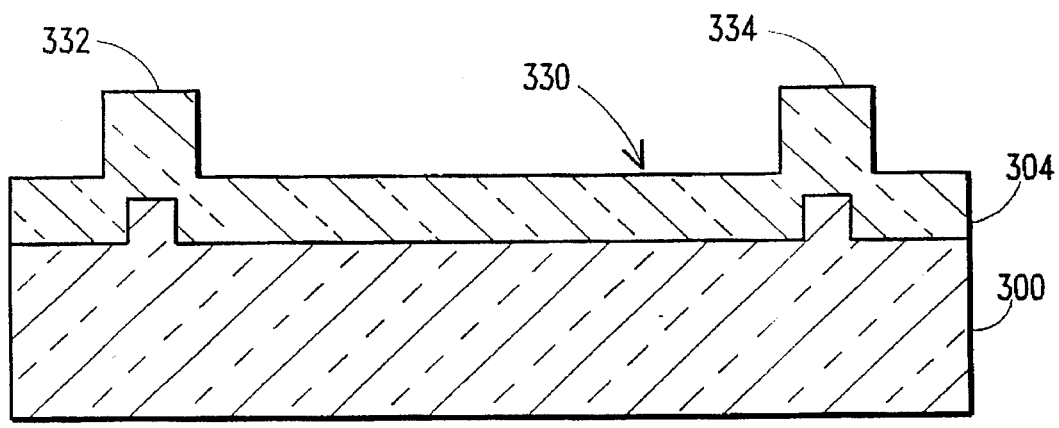
Figure 16:
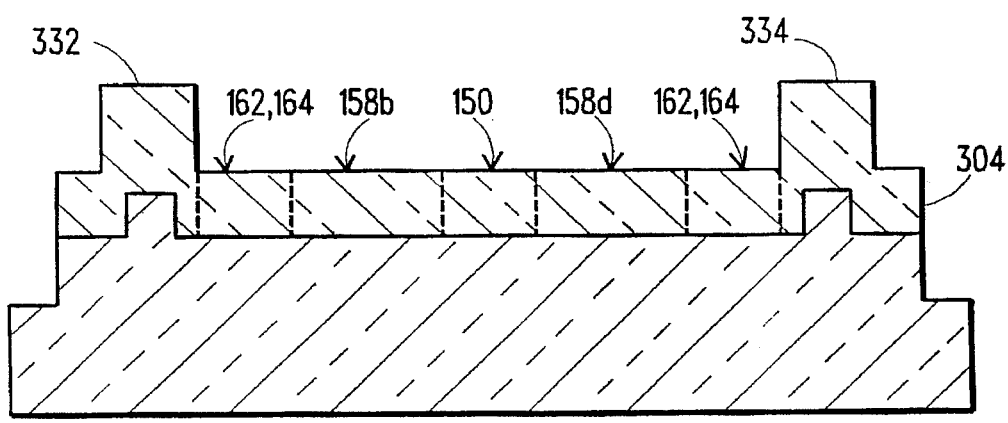

Referring now to FIGS. 11–17, the fabrication of the vibrating wheel gyroscope of FIG. 8 will be described. It will be appreciated that this fabrication technique is readily adapted for fabricating the micromechanical gyroscope embodiments of FIGS. 1, 7, 9 or 10. The cross-sectional views of FIGS. 11 and 12 are taken along the output axis C 180 of FIG. 8, the cross-sectional views FIGS. 13 and 14 are taken along the input axis A 174 of FIG. 8 and the cross-sectional views of FIGS. 15 and 16 are taken along axis B of FIG. 8.

Referring initially to FIG. 11, a silicon substrate 300 having a thickness on the order of 500 microns has a top surface 302 which is patterned and etched with a conventional photolithographic process to provide protrusions 306, 308. Protrusions 306, 308 will provide support posts 168a, 168b (FIG. 8), as will become apparent.

The etched top surface 302 of substrate 300 is thereafter doped to a predetermined depth such as to approximately ten microns, to provide doped layer 304. The doping diffusion follows the contours of the surface giving rise to the cross-sectional profile shown in FIG. 11. In the illustrative embodiment, layer 304 is doped with boron. This boron doped layer 304 will also provide the wheel assembly 144 of the gyroscope 140. Referring also to FIG. 12, the doped semiconductor structure is thereafter patterned and etched, such as by reactive ion etching (RIE), to define the wheel assembly 144 in accordance with requirements of the particular application. In the illustrative embodiment, the etching of the semiconductor structure of FIG. 11 forms regions 316, 318 which provide portions of the outer rim 160 along axis C 180 (FIG. 8) and further separates a central portion including regions 306, 308 from the spaced regions 316, 318, respectively, as shown. The portion 320 of doped layer 304 between post regions 306, 308 forms the central hub 150 (FIG. 8) and the output flexures 170a, 170b of the gyroscope 140.

Referring now to FIGS. 13 and 14, a cross-section of the gyroscope 140 along input axis A 174 (FIG. 8) is shown at the same fabrication steps as FIGS. 11 and 12, respectively. More specifically, in FIG. 13, the silicon substrate 300 is shown to have boron doped layer 304 formed thereon. Note that this cross-section of gyroscope 140 along axis A does not cut through any protruding, or mesa regions, like regions 306, 308 of FIG. 11.

The RIE step by which the structure of FIG. 12 is formed further forms three regions 324, 326 and 328 along axis A, as shown in FIG. 14. Central region 326 forms the inner hub 150 (FIG. 8) and spaced regions 324, 328 form portions of the outer rim 160 of the wheel assembly 144.

Referring also to FIGS. 15 and 16, a cross-section of the gyroscope 140 along axis B (FIG. 8) is shown. Specifically, FIG. 15 shows a pair of protruding regions, or mesas 332, 334 formed in the top surface 330 of substrate 300 by a conventional photolithographic and etching technique. The boron doped layer 304 diffused into the substrate 300 follows the surface contour. The RIE step by which the structure shown in FIGS. 12 and 14 is provided yields the structure of FIG. 16 along axis B. More particularly, the etching step cuts through the boron doped layer 304, as shown. The regions 332, 334 form posts or anchor points which serve to suspend the stator electrodes 146a, 146e (FIG. 8) over the substrate shown in FIG. 17. The region of the boron doped layer 304 between anchor posts 332, 334 forms spoke flexures 158b, 158d, inner hub 150, and interleaved finger-like members 162 of the wheel assembly 144, as well as the finger-like members 164 of the stator 148.

Figure 17:
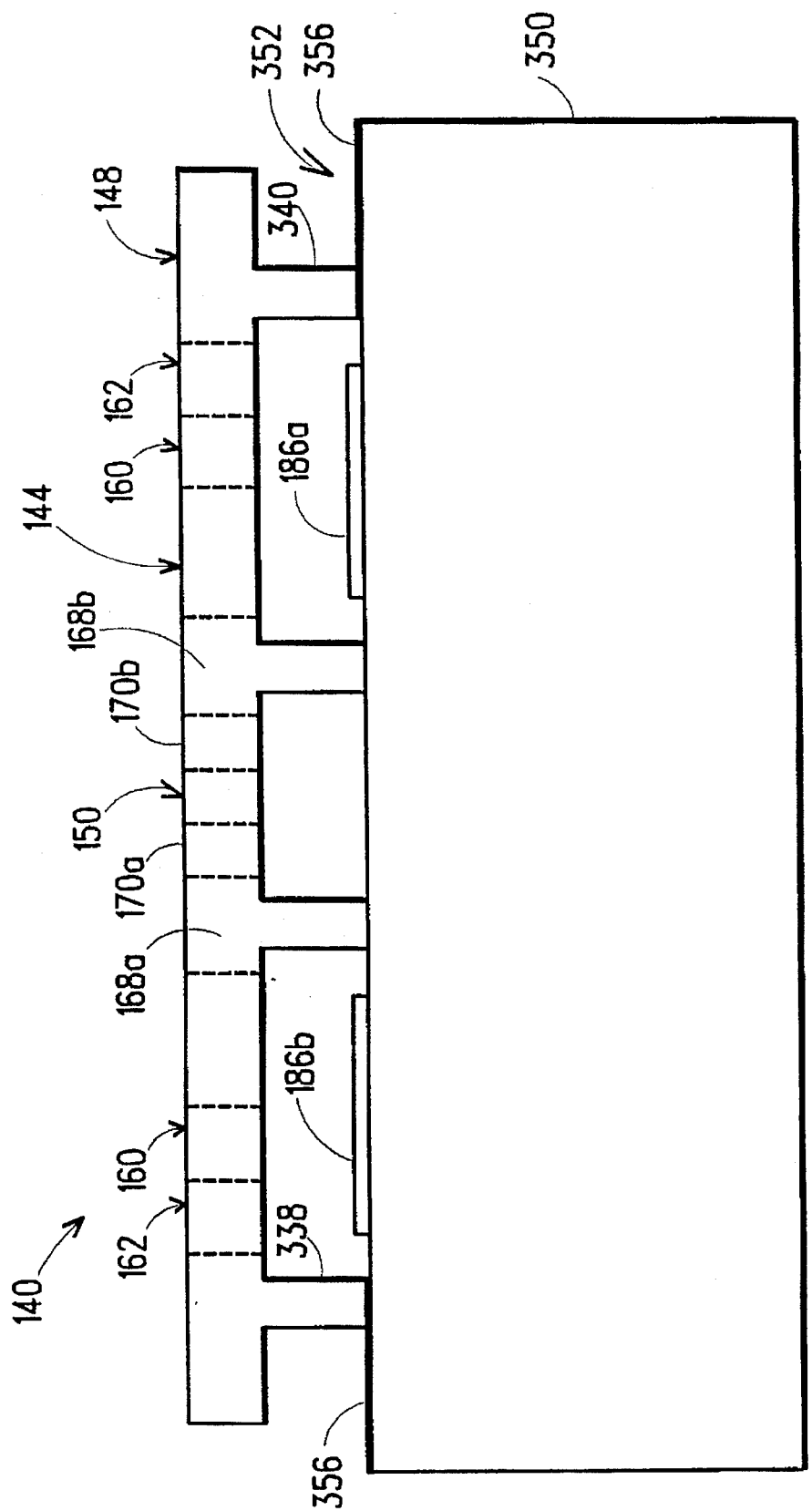
FIG. 17 is a partial cross-sectional view of the gyroscope of FIG. 8.

Referring to FIG. 17, a cross-sectional view of the completed gyroscope 140 of FIG. 8 is shown taken along axis C. A device support, or substrate 350 is provided having a thickness of approximately 750 microns. In one embodiment, the substrate 350 is comprised of glass, such as PYREX™. The sense electrodes 186a, 186b are formed over the top surface 352 of the PYREX™ substrate 350. The electrodes 186a, 186b may be comprised of any suitable conductive material, such as a multilayered deposition of titanium tungsten, palladium, and gold and may be deposited by any suitable technique, such as sputtering. Also provided on a top surface 352 of substrate 350 are conductive traces 356 which extend from the stator mesas 332, 334 (FIG. 16) to edge portions of the substrate 350, as shown. Traces 356 provide electrical connection to the drive electrodes 146a–146h (FIG. 8) for applying a drive signal to the drive electrodes.

Once the PYREX™ substrate 350 is processed to form electrodes 186a, 186b and conductive traces 356 thereover, the wheel assembly structure shown along different axes in the cross-sections of FIGS. 12, 14 and 16 is bonded to the top surface 352 of substrate 350. More particularly, the silicon structure is inverted and bonded to the glass substrate 350 by anodic bonding. Although not shown, it will be appreciated that a silicon substrate may be used in conjunction with alloy bonding of the wheel assembly substrate to a silicon substrate. Thereafter, the silicon substrate 300 is removed, such as by etching. The boron doped wheel assembly 144 and stator 148 are thus suspended over the glass substrate 350, as shown in FIG. 17. Features of the wheel assembly 144 shown in the view of FIG. 17 include the central hub 150, output flexures 170a, 170b, support posts 168a, 168b, outer rim 160, and rotor finger-like electrodes 162.

It will be appreciated by those of skill in the art that various modifications to the gyroscopes described herein may be practiced without departing from the spirit of the invention. For example, the gyroscopes described herein may include a guard band electrode positioned and formed as described in a co-pending U.S. patent application Ser. No. 08/297,655 entitled MICROMECHANICAL SENSOR WITH A GUARDBAND ELECTRODE, which is incorporated herein by reference.

Having described the preferred embodiments of the invention, it will now become apparent to one of skill in the art that other embodiments incorporating their concepts may be used. It is felt therefore that these embodiments should not be limited to disclosed embodiments but rather should be limited only by the spirit and scope of the appended claims.

We claim:

1. A micromechanical vibrating wheel gyroscope comprising:

a support oriented in a first plane;

a wheel assembly disposed over said support and parallel to said first plane, said wheel assembly comprising an inner hub and an outer wheel coupled to said inner hub by at least one spoke, said outer wheel being adapted for vibrating rotationally in said first plane about a drive axis and being responsive to a rotational rate about an input axis coplanar to said first plane for providing an output torque about an output axis coplanar to said first plane, wherein said outer wheel has a plurality of finger-like members extending therefrom and wherein said at least one spoke has a box-shaped region therein;

a post assembly between said support and said wheel assembly for flexibly suspending said wheel assembly over said support, said post assembly comprising at least one post extending from said support and at least one post flexure extending laterally from said at least one post to said inner hub of said wheel assembly; and a plurality of drive electrodes supported over said support and having a plurality of finger-like members extending therefrom and being interleaved with said plurality of finger-like members extending from said outer wheel of said wheel assembly.

2. The gyroscope recited in claim 1 wherein said support is comprised of PYREX™.

3. A gyroscope comprising:

a support oriented in a first plane;

a wheel assembly disposed over said support and parallel to said first plane, said wheel assembly adapted for vibrating rotationally in said first plane about a drive axis and being responsive to a rotational rate about an input axis coplanar to said first plane for providing an output torque about an output axis coplanar to said first plane, said wheel assembly comprising an inner hub, an outer wheel, and a plurality of spoke flexures extending between said inner hub and said outer wheel, wherein at least one of said plurality of spoke flexures includes a protruding portion for providing strain relief due to said wheel assembly rotational vibration; and a post assembly between said support and said wheel assembly for flexibly supporting said wheel assembly and said support.

4. The gyroscope recited in claim 3 wherein said protruding portion is box-shaped.

5. The gyroscope recited in claim 3 wherein said post assembly comprises a post extending substantially vertically from said support and at least one post flexure coupled between said post and said inner hub so as to suspend said inner hub over said support, wherein said at least one post flexure flexes in response to a rate about the output axis.

6. The gyroscope recited in claim 5 wherein said at least one post flexure has a slot disposed therein.

7. The gyroscope recited in claim 6 wherein said gyroscope has a resonant frequency associated therewith and the length of said slot is extendable to vary said resonant frequency of said gyroscope.

8. The gyroscope recited in claim 3 wherein said gyroscope has a resonant frequency associated therewith and said support is electrically isolated from said wheel assembly, wherein said support is adapted for being biased with respect to said wheel assembly to vary said resonant frequency.

9. The gyroscope recited in claim 3 wherein said plurality of spoke flexures are curved.

10. The gyroscope recited in claim 9 wherein said plurality of spoke flexures are symmetrically curved.

11. The gyroscope recited in claim 3 wherein said at least one post flexure has a shape selected from the group consisting of "U", "T", "V", or "I" shape.

12. The gyroscope recited in claim 3 wherein said outer wheel is hollow in portions distal from said input axis and solid in portions proximal to said input axis.

13. The gyroscope recited in claim 3 further comprising a drive electrode suspended over said support and having a plurality of finger-like members extending therefrom in said first plane and wherein said outer wheel of said wheel assembly has a plurality of finger-like members extending therefrom in said first plane and being interleaved with said plurality of finger-like members extending from said drive electrode and drive electronics connected to said drive electrode, said drive electronics receiving a drive signal to electrostatically vibrate said outer wheel rotationally at a predetermined frequency.

14. The vibrating gyroscope structure recited in claim 13 wherein said predetermined frequency is at least near a resonant frequency of the output axis of said wheel assembly.

15. The vibrating gyroscope structure recited in claim 3 wherein the drive axis has a resonant frequency associated therewith, said drive axis resonant frequency being within 5% of a resonant frequency associated with the output axis.

16. The gyroscope recited in claim 13 further comprising at least two drive electrodes interconnected by a rim, wherein said rim has a loop-shaped region extending outward therefrom in said first plane.

17. A micromechanical device comprising:

a substrate;

a proof mass suspended over said substrate and adapted for being displaced in response to a stimulus; and a support supporting said proof mass over said substrate, said support having a plurality of flexures and at least one protruding portion positioned along respective one of said plurality of flexures and adapted for elongating in response to said displacement of said proof mass so as to absorb a non-linear stiffening force incident on said plurality of flexures as a result of displacement of said proof mass.

18. The micromechanical device recited in claim 17 wherein said at least one protruding portion is box-shaped.

19. The micromechanical device recited in claim 18 wherein said proof mass is wheel-shaped and said support comprises an inner hub, said plurality of flexures extending between said inner hub and said wheel-shaped proof mass, and a post assembly positioned between said substrate and said inner hub.

20. A micromechanical device comprising:

a substrate;

a proof mass suspended over said substrate and adapted for being displaced in response to a stimulus;

at least a pair of symmetrical curved beams supporting said proof mass over said substrate, said at least a pair of beams comprising a first curved beam having a concave surface and a convex surface and a second curved beam having a concave surface and a convex surface, wherein said concave surface of said first beam opposes said concave surface of said second beam.

21. A micromechanical device comprising:

a substrate;

a wheel assembly disposed over said substrate comprising an inner hub, an outer wheel and a plurality of spoke flexures extending between said inner hub and said outer wheel, wherein a first of said plurality of spoke flexures defines a concave surface and a convex surface and a second of said plurality of spoke flexures defines a concave surface and a convex surface, wherein said concave surface of said first of said plurality of spoke flexures opposes said concave surface of said second of said plurality of spoke flexures, and wherein said plurality of spoke flexures are relatively flexible about a drive axis and are relatively stiff about an input axis and an output axis; and a post assembly disposed between said substrate and said wheel assembly for flexibly supporting said wheel assembly over said substrate.

* * * * *

UNITED STATES PATENT AND TRADEMARK OFFICE
CERTIFICATE OF CORRECTION

PATENT NO. : 5,650,568
DATED : July 22, 1997
INVENTOR(S) : Paul Greiff

It is certified that error appears in the above-identified patent and that said Letters Patent is hereby corrected as shown below:

Column 11, line 67, "layer 90°." should read --layer 90.--.

Column 21, claim 17, line 1, "along respective" should read --along a respective--.

Signed and Sealed this

Eighteenth Day of August, 1998

Attest:

BRUCE LEHMAN

Attesting Officer        Commissioner of Patents and Trademarks